US010014298B1

(12) United States Patent
Zang et al.

(10) Patent No.: US 10,014,298 B1
(45) Date of Patent: Jul. 3, 2018

(54) METHOD OF FORMING FIELD EFFECT TRANSISTORS WITH REPLACEMENT METAL GATES AND CONTACTS AND RESULTING STRUCTURE

(71) Applicant: GLOBALFOUNDRIES INC., Grand Cayman (KY)

(72) Inventors: Hui Zang, Guilderland, NY (US); Haigou Huang, Rexford, NY (US); Xiaofeng Qiu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/844,840

(22) Filed: Dec. 18, 2017

Related U.S. Application Data

(62) Division of application No. 15/622,949, filed on Jun. 14, 2017, now Pat. No. 9,911,736.

(51) Int. Cl.
*H01L 21/8234* (2006.01)
*H01L 27/088* (2006.01)
*H01L 21/3105* (2006.01)
*H01L 29/66* (2006.01)
*H01L 29/49* (2006.01)
(Continued)

(52) U.S. Cl.
CPC .... *H01L 27/0886* (2013.01); *H01L 21/31053* (2013.01); *H01L 21/823431* (2013.01); *H01L 21/823468* (2013.01); *H01L 21/823475* (2013.01); *H01L 21/823481* (2013.01); *H01L 29/49* (2013.01); *H01L 29/66545* (2013.01);
(Continued)

(58) Field of Classification Search
CPC ......... H01L 21/28123; H01L 21/76229; H01L 21/823481; H01L 21/823431; H01L 21/823437

USPC ....................................................... 438/284
See application file for complete search history.

(56) References Cited

U.S. PATENT DOCUMENTS 9,064,932 B1   6/2015 Pham et al.
9,305,785 B2   4/2016 Wei et al.
(Continued)

OTHER PUBLICATIONS

U.S. Appl. No. 15/622,949, Office Action Communication dated Oct. 19, 2017, pp. 1-6.

(Continued)

*Primary Examiner* — George Fourson, III
(74) *Attorney, Agent, or Firm* — Gibb & Riley, LLC; Francois Pagette

(57) ABSTRACT

In a method for forming an integrated circuit (IC) structure, which incorporates multiple field effect transistors (FETs) with discrete replacement metal gates (RMGs) and replacement metal contacts (RMCs), gate cut trench(es) and contact cut trench(es) are formed at the same process level. These trench(es) are then filled at the same time with the same isolation material to form gate cut isolation region(s) for electrically isolating adjacent RMGs and contact cut isolation region(s) for electrically isolating adjacent RMCs, respectively. The selected isolation material can be a low-K isolation material for optimal performance. Furthermore, since the same process step is used to fill both types of trenches, only a single chemical mechanical polishing (CMP) process is needed to remove the isolation material from above the gate level, thereby minimizing gate height loss and process variation. Also disclosed herein is an IC structure formed according to the method.

17 Claims, 35 Drawing Sheets

(51) Int. Cl.
*H01L 21/762* (2006.01)
*H01L 21/28* (2006.01)

(52) U.S. Cl.
CPC .. *H01L 21/28123* (2013.01); *H01L 21/76229* (2013.01); *H01L 21/823437* (2013.01)

(56) References Cited

U.S. PATENT DOCUMENTS

| | | |
|---|---|---|
| 9,390,979 B2 | 7/2016 | Wei et al. |
| 9,397,004 B2 | 7/2016 | Bouche et al. |
| 9,425,288 B2 | 8/2016 | Zhong et al. |
| 9,478,662 B2 | 10/2016 | Labonte et al. |
| 9,520,482 B1 | 12/2016 | Chang et al. |
| 9,614,050 B2 | 4/2017 | Yin et al. |
| 9,679,985 B1 | 6/2017 | Wu et al. |
| 2007/0218635 A1 | 9/2007 | Seliskar |
| 2013/0277758 A1* | 10/2013 | Chang ............ H01L 21/823828 257/390 |
| 2014/0015051 A1 | 1/2014 | Chan et al. |
| 2014/0042513 A1 | 2/2014 | Naito et al. |
| 2014/0167172 A1* | 6/2014 | Chen ................ H01L 29/6681 257/368 |
| 2014/0339629 A1 | 11/2014 | Xie et al. |
| 2015/0214059 A1 | 7/2015 | Bouche et al. |
| 2016/0133632 A1 | 5/2016 | Park et al. |
| 2017/0125530 A1 | 5/2017 | Zhang et al. |
| 2017/0125543 A1 | 5/2017 | Greene et al. |
| 2017/0148682 A1 | 5/2017 | Basker et al. |
| 2017/0162688 A1 | 6/2017 | Wei et al. |
| 2017/0222003 A1 | 8/2017 | Gan et al. |
| 2017/0229451 A1 | 8/2017 | Chang et al. |
| 2017/0278752 A1* | 9/2017 | Ryckaert ........... H01L 21/76897 |
| 2017/0345820 A1* | 11/2017 | Lin ................ H01L 21/823431 |

OTHER PUBLICATIONS

U.S. Appl. No. 15/622,949, Notice of Allowance dated Nov. 22, 2017, pp. 1-13.

* cited by examiner

METHOD OF FORMING FIELD EFFECT TRANSISTORS WITH REPLACEMENT METAL GATES AND CONTACTS AND RESULTING STRUCTURE

CROSS-REFERENCE TO RELATED APPLICATIONS

The present invention claims the benefit under 35 U.S.C. § 120 as a divisional of U.S. patent application Ser. No. 15/622,949 filed on Jun. 14, 2017, now issued as U.S. Pat. No. 9,911,736 on Mar. 6, 2018, the entire teachings of which are incorporated herein by reference.

BACKGROUND

Field of the Invention

The present invention relates to integrated circuits (ICs) and, more particularly, to methods of forming an IC structure that incorporates multiple field effect transistors (e.g., fin-type field effect transistors (FINFETs)) with discrete replacement metal gates (RMGs) and contacts.

Description of Related Art

In integrated circuit (IC) design, cells (also referred to as library elements) typically represent a set of field effect transistors (FETs) (e.g., a set of fin-type field effect transistors (FINFETs)) and the interconnect structure(s) that connect those FETs. An exemplary cell can incorporate multiple parallel semiconductor bodies (e.g., semiconductor fins), including at least one first semiconductor body with a first channel region and first source/drain regions for at least one first FET with a first-type conductivity (e.g., a P-type FET) and at least one second semiconductor body with a second channel region and second source/drain regions for at least one second FET with a second-type conductivity (e.g., an N-type FET). A first gate (e.g., a first replacement metal gate (RMG)) can traverse the first semiconductor body(ies) at the first channel region and a second gate (e.g., a second replacement metal gate (RMG)) can be in end-to-end alignment with the first gate and can traverse the second semiconductor body(ies) at the second channel region. The first gate can have a first work function for optimal performance of the first FET and the second gate can have a second work function for optimal performance of the second FET. Depending upon the cell design, the first gate and the second gate can be physically separated and electrically isolated by a gate cut isolation region, which is above isolation layer in an area between the first semiconductor fin(s) and the second semiconductor fin(s). Additionally, first metal contacts (e.g., first replacement metal contacts (RMCs)) can traverses the first semiconductor body(ies) at the first source/drain regions on opposing sides of the first gate and second metal contacts (e.g., second replacement metal contacts (RMCs)) can be in end-to-end alignment with the first metal contacts and can traverse the second semiconductor body(ies) at the second source/drain regions on opposing sides of the second gate. Depending upon the cell design, adjacent first and second metal contacts can be physically separated and electrically isolated by a contact cut isolation region, which is also above the isolation layer in an area between the first semiconductor fin(s) and the second semiconductor fin(s).

The currently used technique for forming such a cell provides for forming the gate cut and contact cut isolation regions at different process levels. The gate cut isolation region is typically formed prior to RMG formation (e.g., at the polysilicon open chemical mechanical polishing (POC) process level) by: forming a gate cut trench, which divides a sacrificial gate into a first sacrificial gate and a second sacrificial gate and which extends vertically to the isolation layer in the area between the first semiconductor fin(s) and the second semiconductor fin(s); filling the gate cut trench with silicon nitride; and performing a chemical mechanical polishing (CMP) process. After the gate cut isolation region is formed, the first sacrificial gate and the second sacrificial gate are selectively removed and replaced with a first RMG and a second RMG, respectively. The contact cut isolation region is typically formed at the middle of the line (MOL) process level by: forming a contact cut trench, which extends vertically through sacrificial oxide and/or other sacrificial material to the isolation layer in the area between the first semiconductor fin(s) and the second semiconductor fin(s); filling the contact cut trench with silicon oxycarbide (SiOC); and performing another CMP process. After the contact cut isolation region is formed, the sacrificial material on the first source/drain regions and the second source/drain regions is selectively removed and replaced with first RMCs and second RMCs, respectively. Unfortunately, because the above-described technique requires two chemical mechanical polishing (CMP) processes to be performed, there is a risk of gate height loss. Furthermore, because the gate cut trench is filled with SiN at the POC level, which has a relatively high dielectric constant, device performance may be downgraded.

SUMMARY

In view of the foregoing, disclosed herein are embodiments of an improved method for forming an integrated circuit (IC) structure that incorporates multiple field effect transistors (FETs) (e.g., fin-type field effect transistors (FINFETs)) with discrete replacement metal gates (RMGs) and replacement metal contacts (RMCs). In the method, gate cut trench(es) and contact cut trench(es) can be formed at the same process level. The gate cut trench(es) and the contact cut trench(es) can then be filled at the same time with the same isolation material to form gate cut isolation region(s) for electrically isolating adjacent RMGs and contact cut isolation region(s) for electrically isolating adjacent RMCs, respectively. The selected isolation material can be a low-K isolation material for optimal performance. Furthermore, since the same process step is used to fill both types of trenches, only a single chemical mechanical polishing (CMP) process is needed to remove the isolation material from above the gate level, thereby minimizing gate height loss and process variation. Also disclosed herein are embodiments of an IC structure formed according to the above-described method.

More particularly, one embodiment of the method includes formation of the above-mentioned trenches at the middle of the line (MOL) process level. Specifically, this embodiment includes forming a first trench (referred to above as a gate cut trench) through gate material at an interface between a first gate (e.g., a first replacement metal gate) and a second gate (e.g., a second RMG). The first gate can be adjacent to a first semiconductor body at a first channel region, which is positioned laterally between first source/drain regions. The second gate can be adjacent to a second semiconductor body at a second channel region, which is positioned laterally between second source/drain regions. At this point in the process, the first source/drain regions and the second source/drain regions can be covered by sacrificial material that also fills the spaces between any adjacent source/drain regions. A second trench (referred to above as a contact cut trench) can be formed through a portion of the sacrificial material that fills a space between two adjacent source/drain regions (e.g., a first source/drain region, which is on the first semiconductor body, and a second source/drain region, which is on the second semiconductor body and adjacent to the first source/drain region). Once the first trench and the second trench are formed, isolation material can be deposited such that it essentially simultaneously fills both the first trench to form a first isolation region (referred to above as a gate cut isolation region) that electrically isolates the first RMG from the second RMG and the second trench to form a second isolation region (referred to above as a contact cut isolation region). A polishing process (e.g., a chemical mechanical polishing (CMP) process) can then be performed to remove the isolation material from above the first gate and the second gate.

Additional processing can be performed to complete the IC structure. This additional processing can include, but is not limited to, replacing remaining sacrificial material adjacent to the first source/drain regions and the second source/drain regions with replacement metal contacts (RMCs) such that these RMCs include at least first and second RMCs to the first and second source/drain regions between which the second isolation region was formed and, consequently, such that the first RMC and second RMC are electrically isolated from each other by the second isolation region.

Another embodiment of the method includes formation of the above-mentioned trenches at the polysilicon open chemical mechanical polishing (POC) process level. Specifically, this embodiment includes forming a first trench through a sacrificial gate (e.g., a polysilicon sacrificial gate) to define a first sacrificial gate and a second sacrificial gate. The first sacrificial gate can be adjacent to a first semiconductor body at a first channel region, which is positioned laterally between first source/drain regions, and the second sacrificial gate can be adjacent to a second semiconductor body at a second channel region, which is positioned laterally between second source/drain regions. At this point in the process, the first source/drain regions and the second source/drain regions can be covered by sacrificial material that also fills the spaces between any adjacent source/drain regions. A second trench (referred to above as a contact cut trench) can be formed through a portion of the sacrificial material that fills a space between two adjacent source/drain regions (e.g., a first source/drain region, which is on the first semiconductor body, and a second source/drain region, which is on the second semiconductor body and adjacent to the first source/drain region). Once the first trench and the second trench are formed, isolation material can be deposited such that it essentially simultaneously fills both the first trench to form a first isolation region (referred to above as a gate cut isolation region) and the second trench to form a second isolation region (referred to above as a contact cut isolation region). A polishing process (e.g., a chemical mechanical polishing (CMP) process) can then be performed to remove the isolation material from above the first sacrificial gate and the second sacrificial gate.

Additional processing can be performed to complete the IC structure. This additional processing can include, but is not limited to, replacing sacrificial gates with replacement metal gates (RMGs) such that these RMGs include at least first and second RMGs that replace the first and second sacrificial gates between which the first isolation region was formed and, consequently, such that the first RMG and the second RMG are electrically isolated from each other by the first isolation region. This additional processing can also include, but is not limited to, replacing remaining sacrificial material adjacent to the first source/drain regions and the second source/drain regions with replacement metal contacts (RMCs) such that these RMCs include at least first and second RMCs to the first and second source/drain regions between which the second isolation region was formed and, consequently, such that the first RMC and second RMC are electrically isolated from each other by the second isolation region.

In each of the above-described method embodiments, the selected isolation material used to fill the first trench and the second trench can be a low-K isolation material for optimal performance. Furthermore, since the same process step is used to fill both types of trenches, only a single chemical mechanical polishing (CMP) process is needed to remove the isolation material from above the gate level, thereby minimizing gate height loss and process variation.

Also disclosed herein is an integrated circuit (IC) structure that incorporates multiple field effect transistors (e.g., fin-type field effect transistors (FINFETs)) with discrete replacement metal gates (RMGs) and replacement metal contacts (RMCs). Specifically, the IC structure can include at least a first transistor and a second transistor.

The first transistor can include a first semiconductor body with a first channel region positioned laterally between first source/drain regions. The first transistor can further include a first replacement metal gate (RMG) adjacent to the first channel region.

The second transistor can include a second semiconductor body with a second channel region positioned laterally between second source/drain regions. The second transistor can further include a second RMG adjacent to the second channel region.

The IC structure can further include replacement metal contacts (RMCs) to the first source/drain regions and the second source/drain regions. These RMCs can include at least a first RMC to a first source/drain region of the first transistor and a second RMC to a second source/drain region of the second transistor, wherein the first source/drain region is positioned laterally adjacent to the second source/drain region.

The IC structure can further include a first isolation region (referred to herein as a gate cut isolation region) and a second isolation region (referred to herein as a contact cut isolation region). The first isolation region can include a first trench, which is filled with isolation material and which is positioned laterally between and immediately adjacent to the first RMG and the second RMG so as to electrically isolate the first RMG and the second RMG from each other. The second isolation region can include a second trench, which is filled with the same isolation material as the first trench (i.e., the isolation material in the first and second trenches is identical) and which is positioned laterally between and immediately adjacent to the first RMC and the second RMC so as to electrically isolation the first RMC and the second RMC from each other.

The isolation material of the first and second isolation regions can be a low-K isolation material for optimal performance. Furthermore, since, during processing, the same step is used to fill the first and second trenches, only a single chemical mechanical polishing (CMP) process is needed to remove the isolation material from above the gate level. Thus, in the above-described IC structure there is minimum gate-to-gate height variation.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
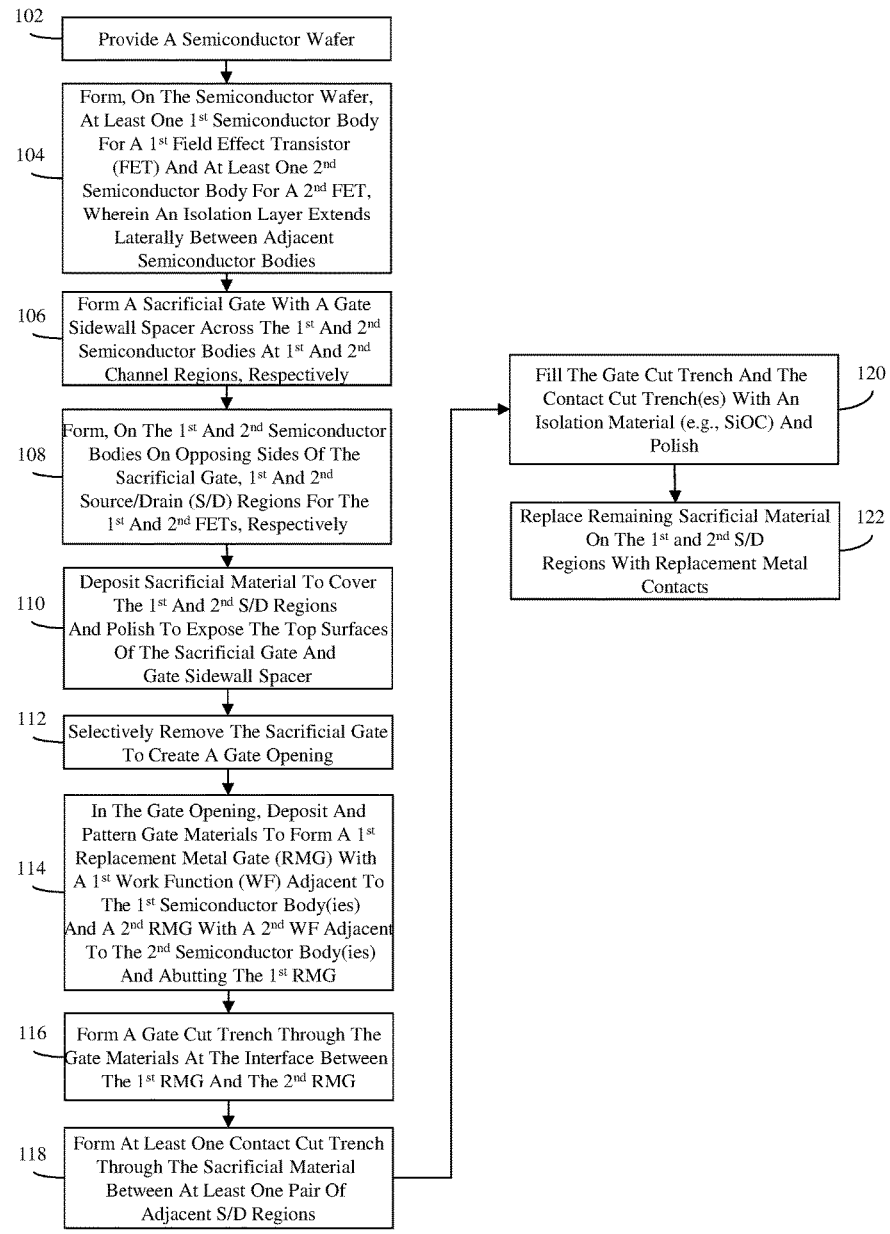
FIG. 1 is a flow diagram illustrating a method of forming an integrated circuit (IC) structure.

As mentioned above, the gate cut and contact cut isolation regions are typically formed at different process levels. For example, the gate cut isolation region is typically formed prior to RMG formation (e.g., at the polysilicon open chemical mechanical polishing (POC) process level) by: forming a gate cut trench, which divides a sacrificial gate into a first sacrificial gate and a second sacrificial gate and which extends vertically to the isolation layer in the area between the first semiconductor fin(s) and the second semiconductor fin(s); filling the gate cut trench with silicon nitride; and performing a chemical mechanical polishing (CMP) process. After the gate cut isolation region is formed, the first sacrificial gate and the second sacrificial gate are selectively removed and replaced with a first RMG and a second RMG, respectively. The contact cut isolation region is typically formed at the middle of the line (MOL) process level by: forming a contact cut trench, which extends vertically through sacrificial oxide and/or other sacrificial material to the isolation layer in the area between the first semiconductor fin(s) and the second semiconductor fin(s); filling the contact cut trench with silicon oxycarbide (SiOC); and performing another CMP process. After the contact cut isolation region is formed, the sacrificial material on the first source/drain regions and the second source/drain regions is selectively removed and replaced with first RMCs and second RMCs, respectively. Unfortunately, because the above-described technique requires two chemical mechanical polishing (CMP) processes to be performed, there is a risk of gate height loss. Furthermore, because the gate cut trench is filled with SiN at the POC level, which has a relatively high dielectric constant, device performance may be downgraded.

In view of the foregoing, disclosed herein are embodiments of an improved method for forming an integrated circuit (IC) structure that incorporates multiple field effect transistors (FETs) (e.g., fin-type field effect transistors (FIN-FETs)) with discrete replacement metal gates (RMGs) and replacement metal contacts (RMCs). In the method, gate cut trench(es) and contact cut trench(es) can be formed at the same process level. The gate cut trench(es) and the contact cut trench(es) can then be filled at the same time with the same isolation material to form gate cut isolation region(s) for electrically isolating adjacent RMGs and contact cut isolation region(s) for electrically isolating adjacent RMCs, respectively. The selected isolation material can be a low-K isolation material for optimal performance. Furthermore, since the same process step is used to fill both types of trenches, only a single chemical mechanical polishing (CMP) process is needed to remove the isolation material from above the gate level, thereby minimizing gate height loss and process variation. Also disclosed herein are embodiments of an IC structure formed according to the above-described method.

More particularly, referring to the flow diagram of FIG. 1, one embodiment of the method includes formation of the above-mentioned trenches at the middle of the line (MOL) process level.

Figure 2A:
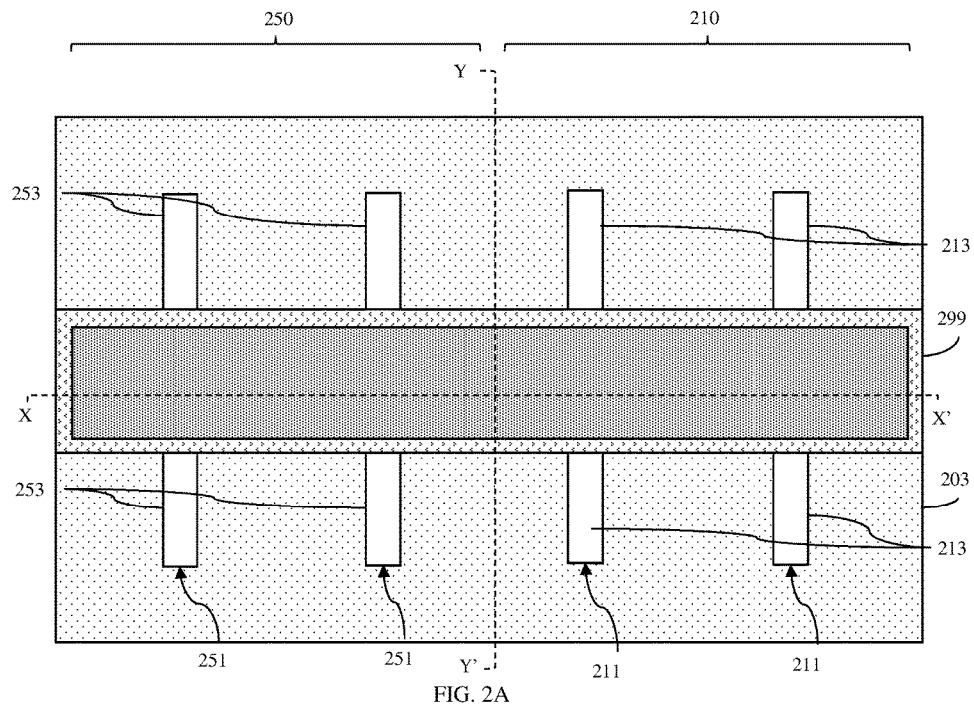
FIG. 2A is a top view diagram and FIGS. 2B-2C are different cross-section diagrams illustrating a partially completed structure formed according to the method of FIG. 1.
Figure 2B:
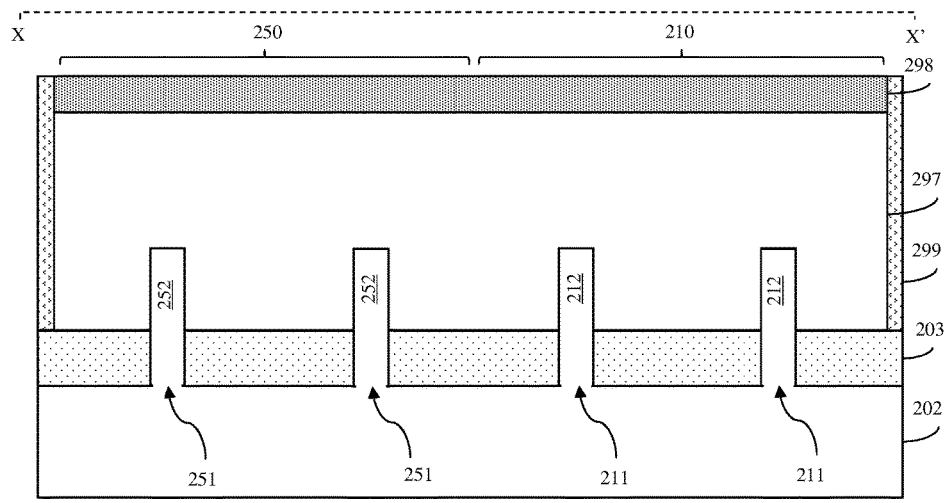

Specifically, this embodiment of the method includes providing a semiconductor wafer (see process 102) and forming a plurality of essentially parallel semiconductor bodies for a plurality of field effect transistors (FETs) on the semiconductor wafer (see process 104). The semiconductor wafer provided at process 102 can be, for example, a bulk semiconductor wafer 202 (e.g., a bulk silicon wafer or other suitable bulk semiconductor wafer), as illustrated in FIGS. 2A-2B. Alternatively, a semiconductor-on-insulator wafer (e.g., a silicon-on-insulator (SOI) wafer) could be used.

The parallel semiconductor bodies formed at process 104 can include one or more first semiconductor bodies 211 for a first FET 210 having a first-type conductivity (e.g., a P-type FET) in a first device region and one or more second semiconductor bodies 251 for a second FET 250 having a second-type conductivity (e.g., an N-type FET) in a second device region, as shown in FIGS. 2A-2B.

As illustrated, the semiconductor bodies 211, 251 can be non-planar semiconductor bodies (e.g., semiconductor fins) for non-planar field effect transistors (e.g., fin-type field effect transistors (FINFETs)). For purposes of this disclosure, a semiconductor fin refers to a relatively tall and thin, elongated, rectangular-shaped, semiconductor body. Additionally, for purposes of illustration, two first semiconductor fins 211 and two second semiconductor fins 251 are shown. However, it should be understood that the figures are not intended to be limiting and that one or more first semiconductor fins and one or more second semiconductor fins could, alternatively, be formed. Techniques for forming such semiconductor fins (e.g., lithographic patterning techniques, sidewall image transfer techniques, replacement fin techniques, etc.) are well known in the art and, thus, the details have been omitted from this specification in order to allow the reader to focus on the salient aspects of the disclosed method. Alternatively, the semiconductor bodies 211, 251 could be formed as planar semiconductor bodies for planar FETs (not illustrated). Such planar semiconductor bodies can be formed, for example, by forming shallow trench isolation (STI) regions in the semiconductor wafer to define the planar semiconductor bodies. Techniques for forming such STI regions to define planar semiconductor bodies in a semiconductor wafer are well known in the art and, thus, the details have been omitted from this specification in order to allow the reader to focus on the salient aspects of the disclosed method.

In any case, by design, each semiconductor body 211, 251 will have designated areas for source/drain regions 213, 253 and a channel region 212, 252 positioned laterally between the source/drain regions 213, 253. For example, the first semiconductor body(ies) 211 will have a first channel region 212 positioned laterally between first source/drain regions 213 and the second semiconductor body(ies) 251 will have a second channel region 252 positioned laterally between second source/drain regions 253. Optionally, each semiconductor body 211, 251 can be doped, either before or after formation, so that its channel region has appropriate type conductivity at a relatively low conductivity level. For example, for a P-type FET, each channel region can have an N− conductivity; whereas, for an N-type FET, each channel region can have a P− conductivity.

It should be noted that, in the case of FINFETs, if the semiconductor wafer on which the semiconductor fins 211, 251 are formed at process 104 is a bulk semiconductor wafer 202, as shown, an isolation layer 203 can be formed around the lower portion of each semiconductor fin 211, 251 and can extend laterally between adjacent semiconductor fins 211, 251. For example, silicon oxide can be deposited over the semiconductor fins 211, 251 and recessed to form an isolation layer 203. If, however, the semiconductor wafer on which the semiconductor fins 211, 251 are formed at process 104 is an SOI wafer, the semiconductor fins 211, 251 can extend essentially vertically upward from the top surface of an insulator layer such that portions of the insulator layer function as an isolation layer extending laterally between adjacent semiconductor fins.

Figure 2C:
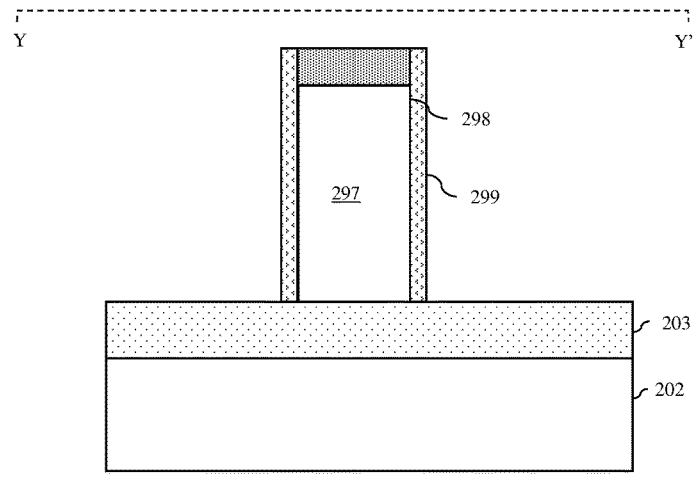

A sacrificial gate 297 (also referred to as a dummy gate) with a sacrificial gate cap 298 and a dielectric gate sidewall spacer 299 can be formed adjacent to each semiconductor body 211, 251 at the channel region 212, 252 (see process 106 and FIGS. 2A-2C). For example, a sacrificial gate 297 can be formed such that it is on a first top surface and first opposing sides of each first semiconductor body 211 at the first channel region 212 and such that it is on a second top surface and second opposing sides of the each second semiconductor body 251 at the second channel region 252. To form such a sacrificial gate 297, a blanket first sacrificial layer (e.g., a thin gate oxide, followed by a sacrificial polysilicon layer or a sacrificial amorphous silicon layer) can be formed above and adjacent to the opposing sides of each semiconductor body 211, 251. A polishing process (e.g., a chemical mechanical polishing (CMP) process) can be performed to ensure that the top surface of the first sacrificial layer is essentially planar. Then, a second sacrificial layer (e.g., a sacrificial nitride layer, a silicon boron carbon nitride layer or other suitable dielectric layer), which is different from the first sacrificial layer, can be formed on the top surface of the first sacrificial layer. The first and second sacrificial layers can then be lithographically patterned and etched to form the sacrificial gate 297 with a sacrificial gate cap 298.

A gate sidewall spacer 299 can then be formed on the sidewalls of the sacrificial gate 297 such that it laterally surrounds and is immediately adjacent to the sacrificial gate 297. The gate sidewall spacer 299 can be formed, for example, using conventional sidewall spacer formation techniques. Such sidewall spacer formation techniques are well known in the art and, thus, the details of those techniques have been omitted from the specification in order to allow the reader to focus on the salient aspects of the disclosed method. In any case, the gate sidewall spacer 299 can be made of silicon nitride, silicon carbon nitride, silicon boron carbon nitride or any other suitable gate sidewall spacer material that is different from the material used for the sacrificial gate 297.

Figure 3:
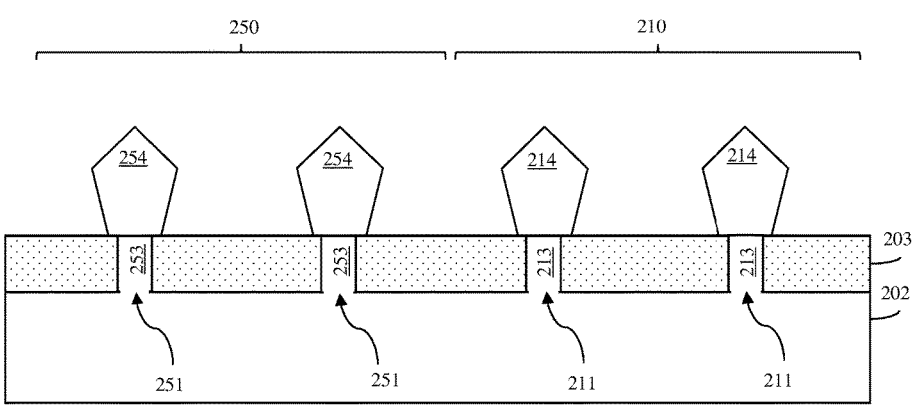
FIG. 3 is a cross-section diagram illustrating a partially completed structure formed according to the method of FIG. 1.
Figure 4A:
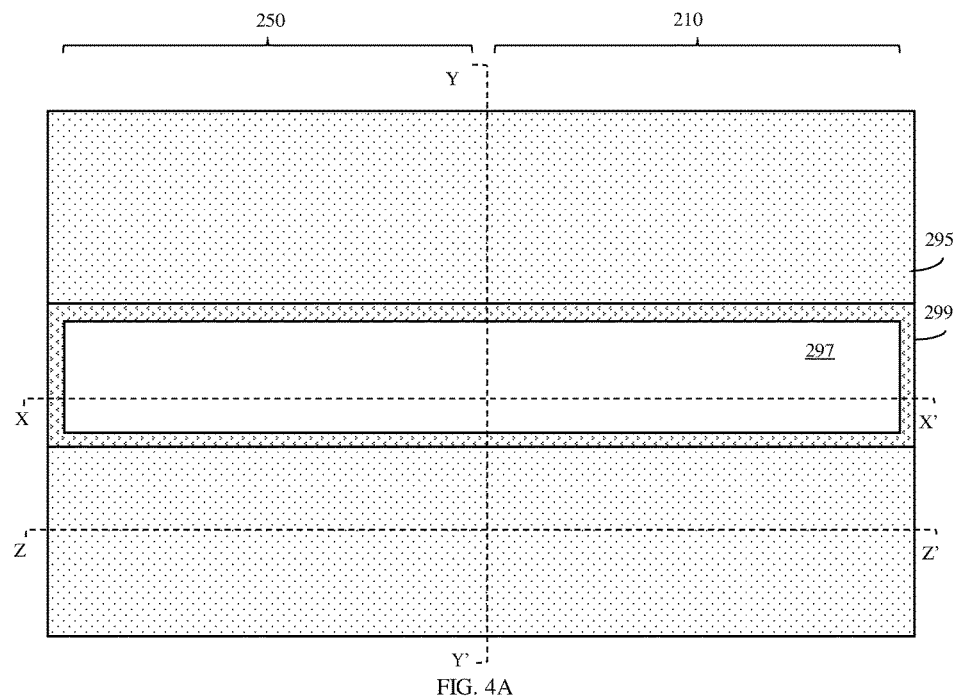
FIG. 4A is a top view diagram and FIGS. 4B-4D are different cross-section diagrams illustrating a partially completed structure formed according to the method of FIG. 1.
Figure 4B:
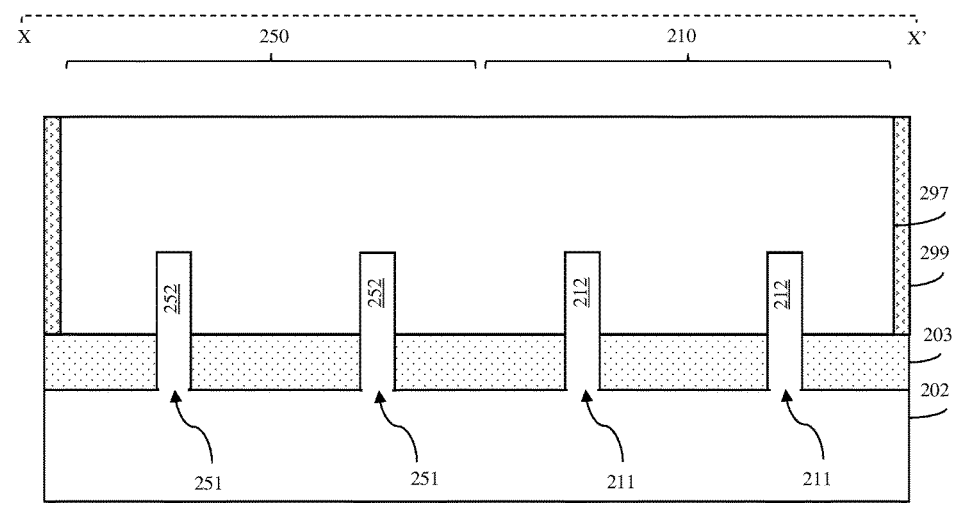
Figure 4C:
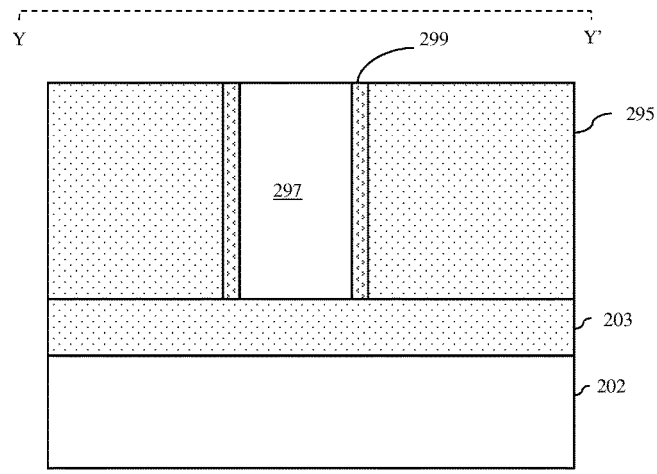
Figure 4D:
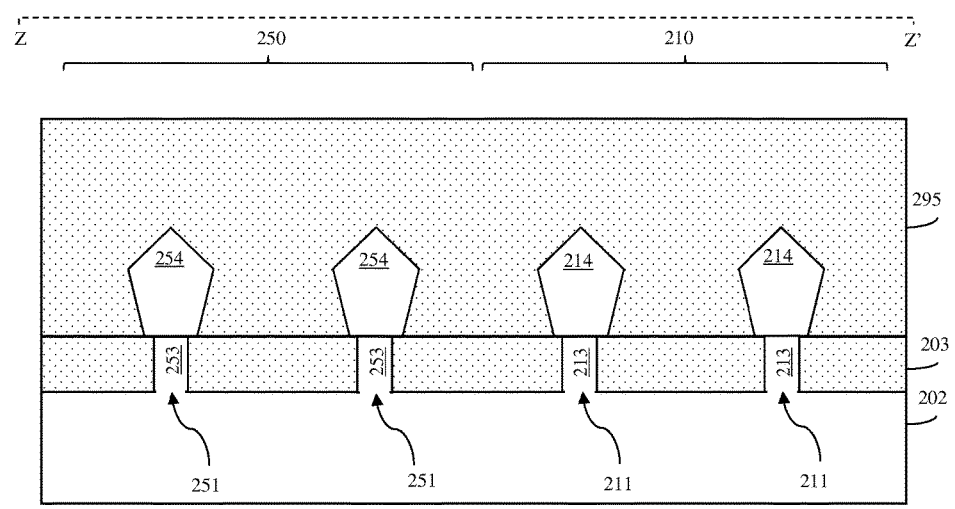

Source/drain regions 213, 253 for the different FETs 210, 250 can be formed using exposed portions of the semiconductor bodies 211, 251 that extend laterally beyond the sacrificial gate 297 and gate sidewall spacer 299 (see process 108). For example, a masked dopant implantation process can be performed to dope the first source/drain regions 213 of the first FET 210, which will have the first-type conductivity, with a first dopant so that they have the first-type conductivity at a relatively high conductivity level (e.g., P+ conductivity for a P-type FET). Another masked dopant implantation process can be performed to dope the second source/drain regions 253 of the second FET 250, which will have the second-type conductivity, with a second dopant so that they have the second-type conductivity at a relatively high conductivity level (e.g., N+ conductivity for an N-type FET). Additionally or alternatively, epitaxial semiconductor material can be deposited on the exposed portions of the semiconductor bodies 211, 251 that extend laterally beyond the sacrificial gate 297 and the gate sidewall spacer 299 to form first epitaxial portions 214 of the first source/drain regions 213 and second epitaxial portions 254 of the second source/drain regions 253 (see FIG. 3). The epitaxial semiconductor material can be in-situ doped or subsequently implanted to achieve the desired conductivity. Optionally, recesses can be formed in the source/drain regions 213, 253 of each semiconductor bodies 211, 251 prior to deposition of epitaxial semiconductor material.

It should be noted that the epitaxial semiconductor material described above may be the same semiconductor material as that used for the semiconductor bodies (e.g., silicon). Alternatively, the epitaxial semiconductor material can be preselected for optimal device performance. For example, for a P-type FET, the epitaxial semiconductor material 214 could be silicon germanium (SiGe), which will enhance majority charge carrier mobility within the P-type FET's channel region and, thereby enhance performance. For an N-type FET, the epitaxial semiconductor material 254 could be silicon carbide (SiC), which will enhance majority charge carrier mobility within the N-type FET's channel region and, thereby enhance performance.

Subsequently, sacrificial material 295 can be deposited over the partially completed structure (see process 110 and FIGS. 4A-4D). The sacrificial material 295 can include a single sacrificial material layer (e.g., a single layer of silicon oxide or some other suitable interlayer dielectric (ILD) material, such as borophosphosilicate glass (BPSG), tetraethyl orthosilicate (TEOS), fluorinated tetraethyl orthosilicate (FTEOS), etc.). Alternatively, the sacrificial material 295 can include multiple sacrificial material layers (e.g., a sacrificial polysilicon layer, a sacrificial dielectric layer, etc.). In any case, the sacrificial material 295 should be different from the dielectric material of the gate sidewall spacer 299 to allow for subsequent selective etching of the sacrificial material 295 at process 122 discussed in greater detail below. As illustrated, the sacrificial material 295 can cover the first source/drain regions 213 (including the first epitaxial portion 214, if present) and the second source/drain regions 253 (including the second epitaxial portion 254, if present) and can further fill the spaces between adjacent source/drain regions. Next, a polishing process (e.g., a chemical mechanical polishing (CMP) process) can be performed in order to expose the top surface of the sacrificial gate 297, as shown.

Figure 5:
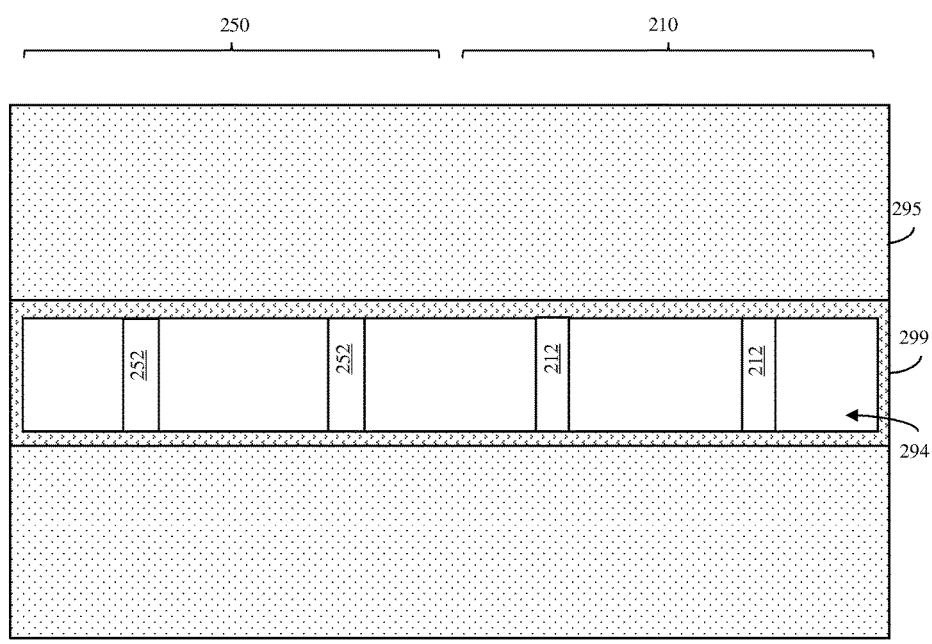
FIG. 5 is a top view diagram illustrating a partially completed structure formed according to the method of FIG. 1.

The sacrificial gate 297 can then be selectively removed (e.g., using a selective etch process) to create a gate opening 294 that exposes the first channel region 212 of each first semiconductor body 211 as well as the second channel region 252 of each second semiconductor body 251 (see process 112 and FIG. 5). It should be noted that the selective etch process should be selective for the material of the sacrificial gate 297 over the materials of the semiconductor bodies 211, 251, the sacrificial material 295, and the gate sidewall spacer 299. Techniques for formation and subsequent selective removal of sacrificial gates are well known in the art and, thus, the details of those techniques have been omitted form this specification in order to allow the readers to focus on the salient aspects of the disclosed methods.

Figure 6A:
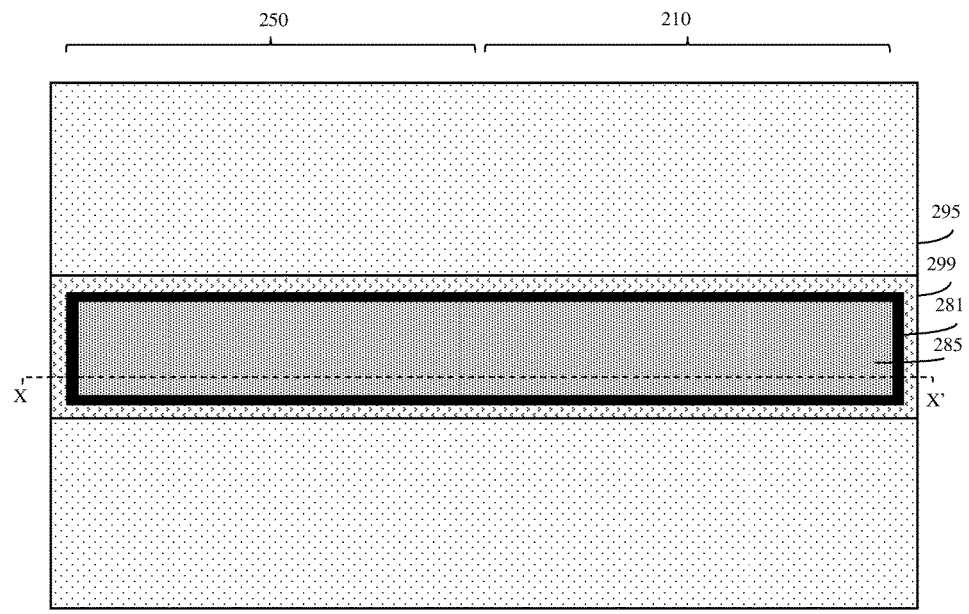
FIG. 6A is a top view diagram and FIG. 6B is a cross-section diagram illustrating a partially completed structure formed according to the method of FIG. 1.
Figure 6B:
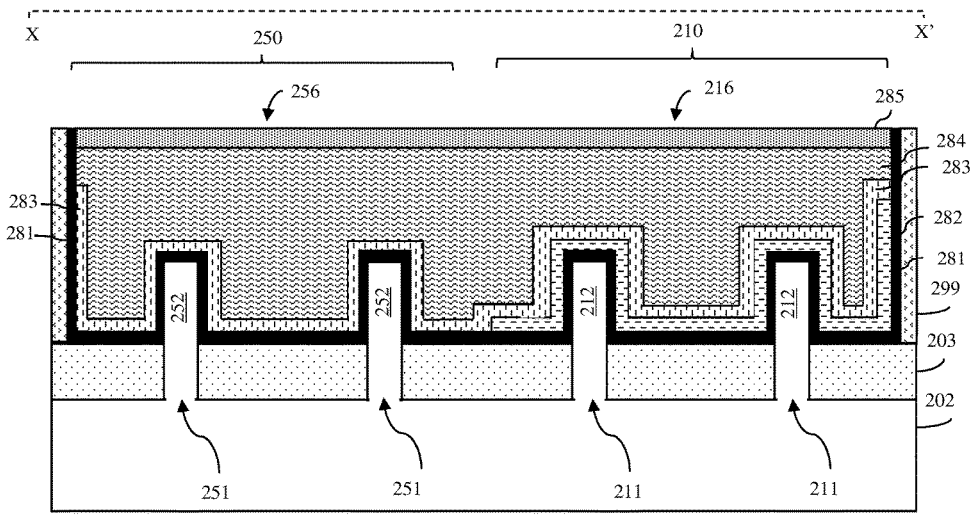

Various gate materials can be deposited into the gate opening 294 and patterned in order to form a first replacement metal gate (RMG) 216 adjacent to the exposed first channel region 212 of each first semiconductor body 211 and a second RMG 256 adjacent to the exposed second channel region 252 of each second semiconductor body 251 (see process 114 and FIGS. 6A-6B).

For example, to form the first RMG 216 and the second RMG 256, a gate dielectric layer 281 and, particularly, a high-K gate dielectric layer can be conformally deposited in the gate opening 294. Subsequently, a first work function metal layer 282 can be conformally deposited in the gate opening 294 over the gate dielectric layer 281. The metal material or metal alloy material of the conformal first work function metal layer 282 can be preselected in order to achieve the optimal gate conductor work function given the first-type conductivity the first FET 210. The first work function metal layer 282 can then be chamfered and patterned. The chamfering process can include: depositing a protective fill material onto the first work function metal layer; recessing the protective fill material; etching away the exposed first work function metal material from above the protective fill material such that the maximum height of the first work function metal layer is below the level of the top surface of the sidewall spacer 299; and removing the protective fill material. The patterning process can include: forming a protective mask over the first device region, removing (e.g., selectively etching away) the first work function metal layer 282 from the second device region, and removing protective mask. Next, a second work function metal layer 283 can be conformally deposited in the gate opening 294 over the first work function metal layer 282 in the first device region and over the gate dielectric layer 281 in the second device region. The metal material or metal alloy material of the conformal second work function metal layer 283 can be preselected in order to achieve the optimal gate conductor work function given the second-type conductivity of the second FET 250. The chamfering process can include: depositing a protective fill material onto the second work function metal layer; recessing the protective fill material; etching away the exposed second work function metal material from above the protective fill material such that the maximum height of the second work function metal layer is below the level of the top surface of the gate sidewall spacer 299; and removing the protective fill material. Finally, a conductive fill material 284 can be deposited to fill any remaining space in the gate opening 294 and a polishing process (e.g., a CMP process) can be performed to remove any RMG materials from above the top surface of the sacrificial material 295.

A dielectric gate cap 285 can be formed on the top surfaces of the first RMG 216 and the second RMG 256. For example, the conductive fill material 284 of the first RMG 216 and the second RMG 256 can be recessed (i.e., etched back) and a dielectric cap layer (e.g., a silicon nitride cap layer) can be deposited over the partially completed structure so as to fill the recess above the conductive fill material 284. Next, a polishing process (e.g., a CMP process) can be performed so as to remove any of the dielectric cap material from above the top surface of the sacrificial material 295, thereby forming the dielectric gate cap 285.

Figure 7A:
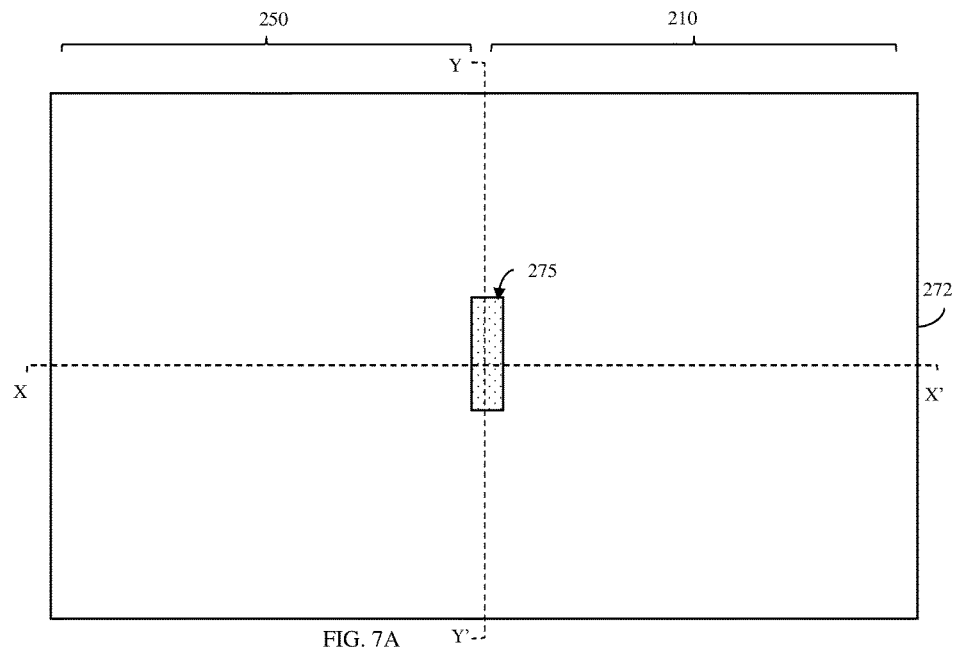
FIG. 7A is a top view diagram and FIGS. 7B-7C are different cross-section diagrams illustrating a partially completed structure formed according to the method of FIG. 1.
Figure 7B:
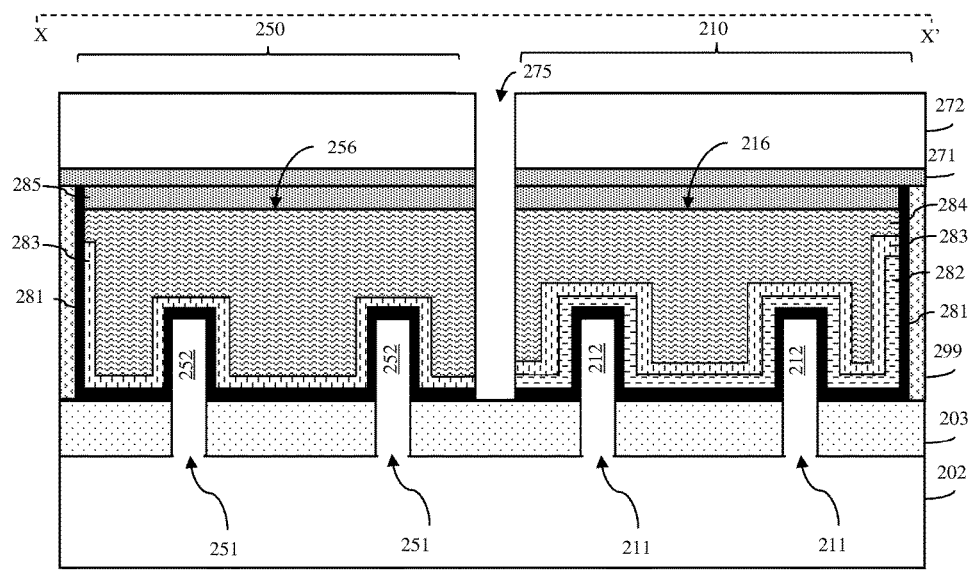
Figure 7C:
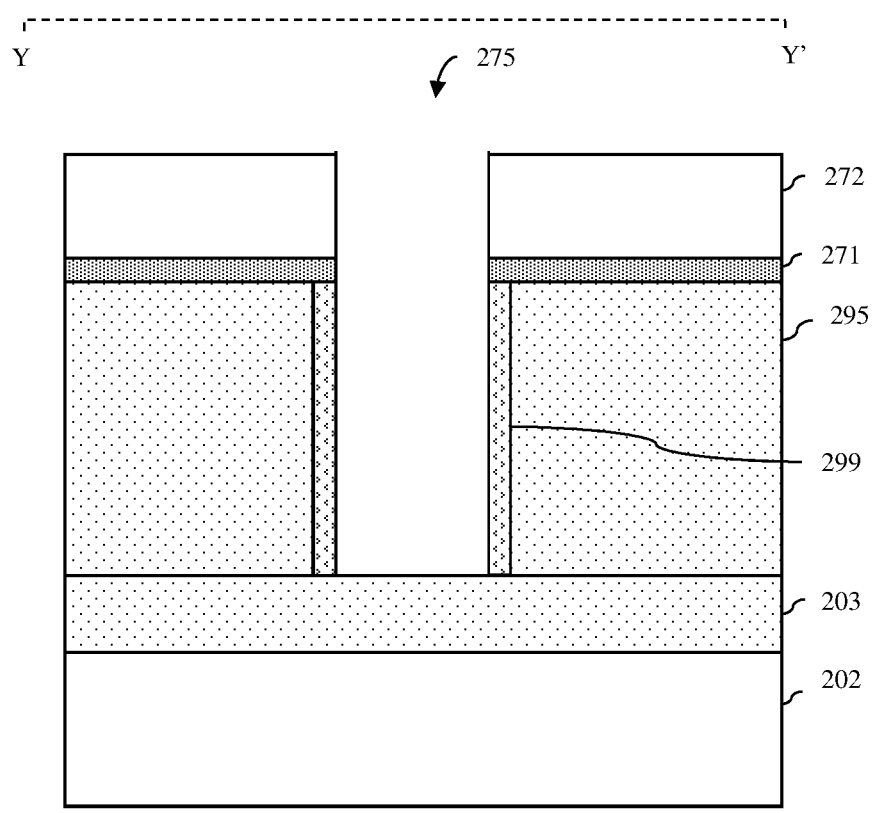
Figure 8:
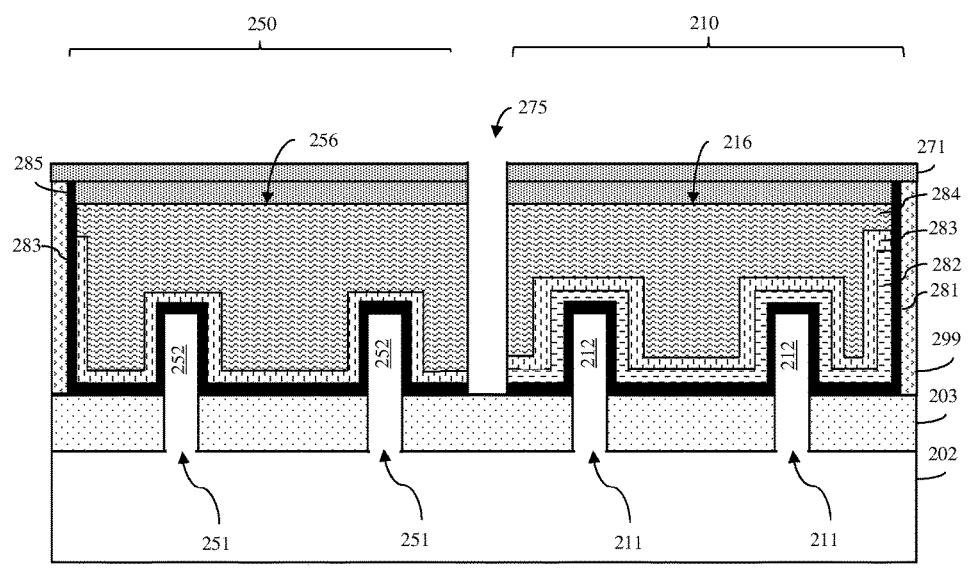
FIG. 8 is a cross-section diagram illustrating a partially completed structure formed according to the method of FIG. 1.
Figure 9A:
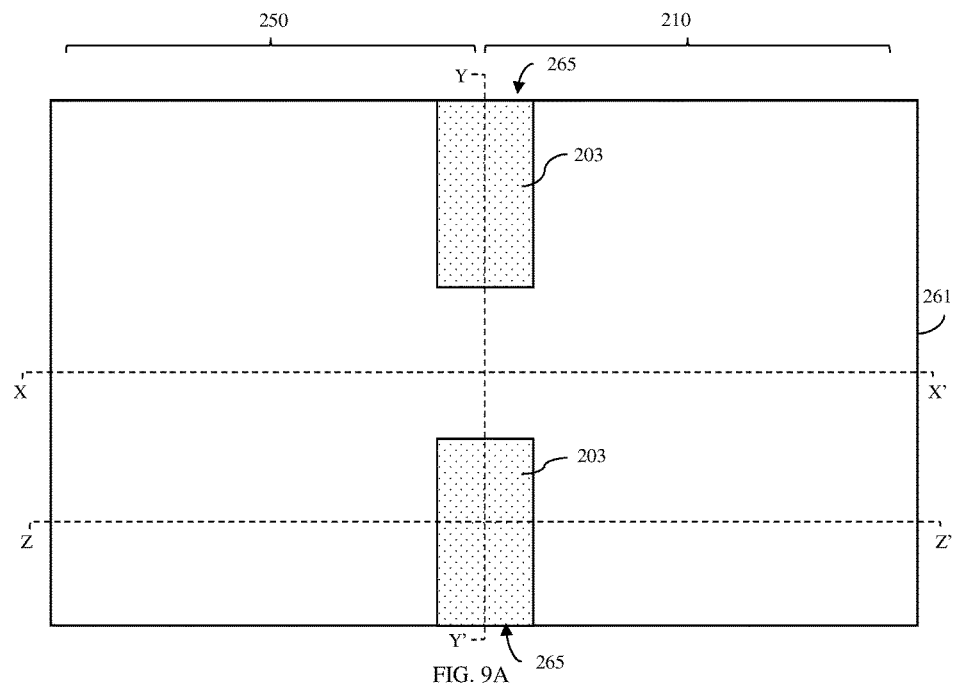
FIG. 9A is a top view diagram and FIGS. 9B-9D are different cross-section diagrams illustrating a partially completed structure formed according to the method of FIG. 1.
Figure 9B:
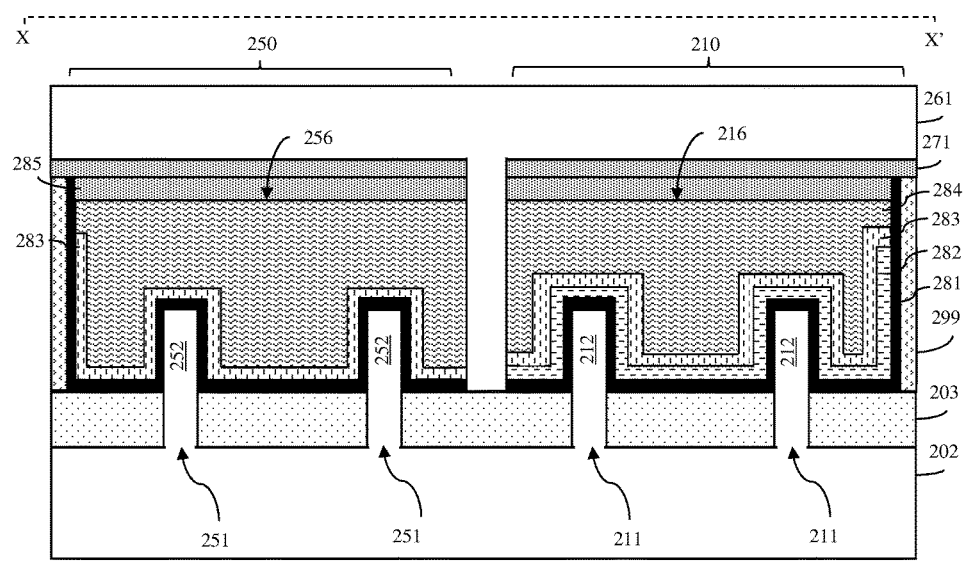
Figure 9C:
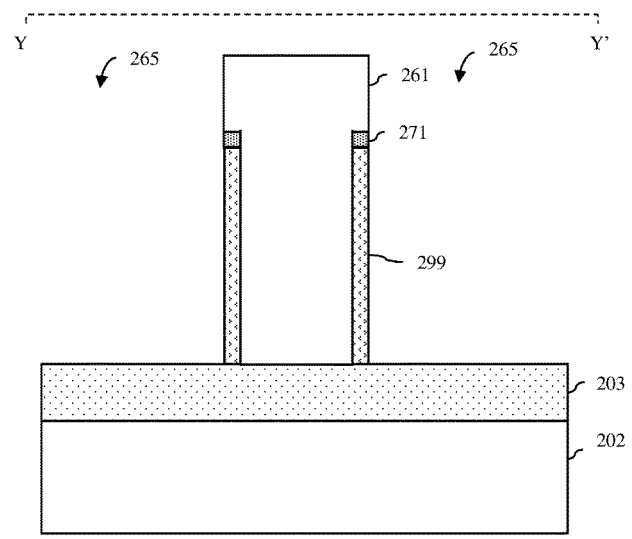
Figure 9D:
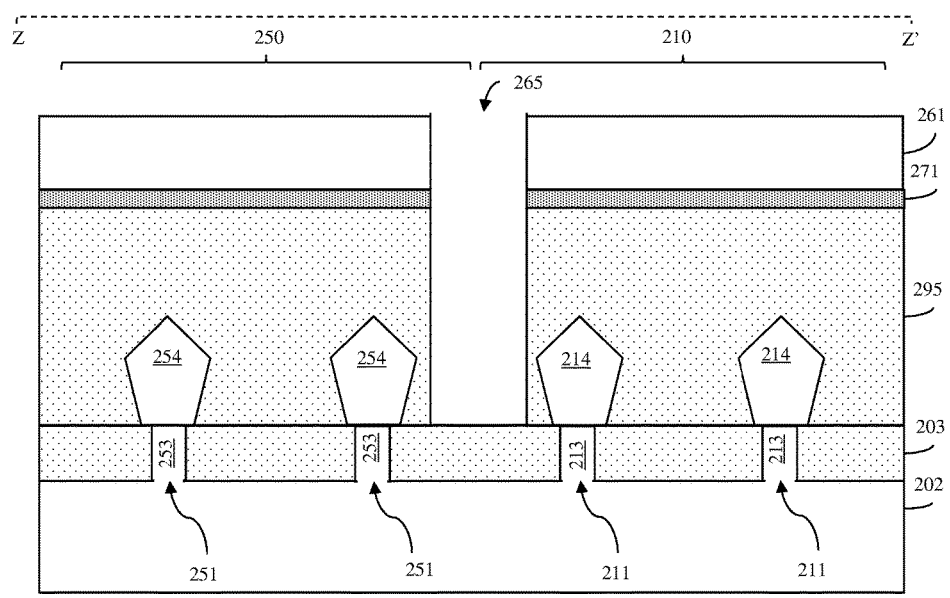
Figure 10A:
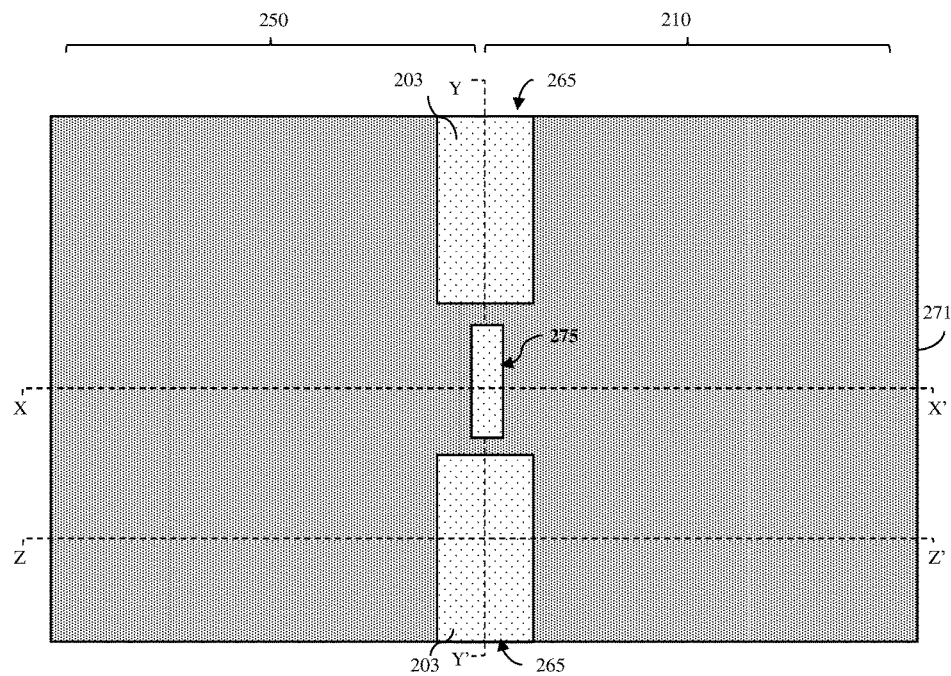
FIG. 10A is a top view diagram and FIGS. 10B-10D are different cross-section diagrams illustrating a partially completed structure formed according to the method of FIG. 1.
Figure 10B:
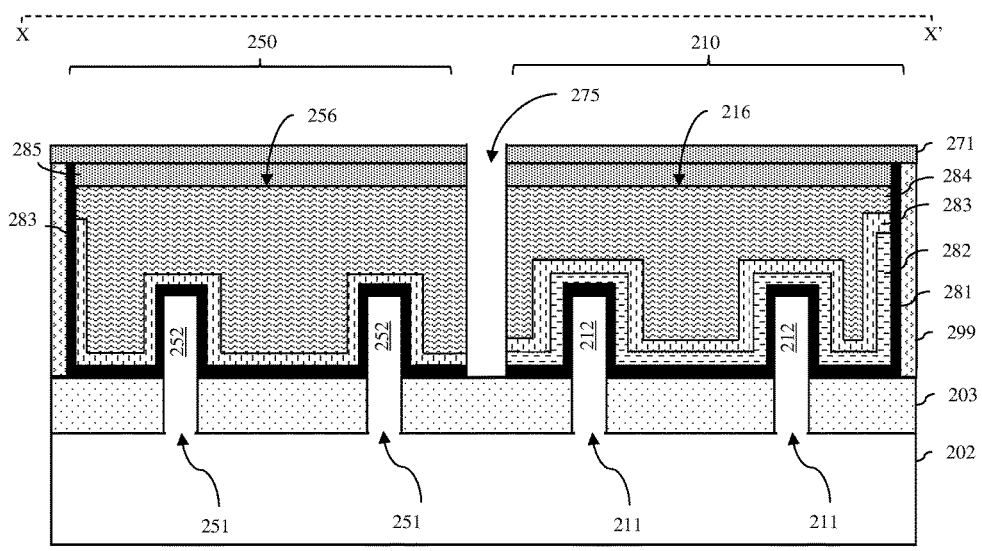
Figure 10C:
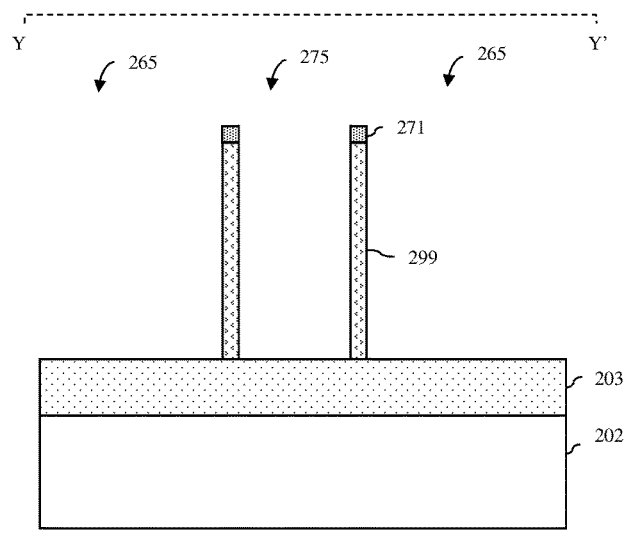
Figure 10D:
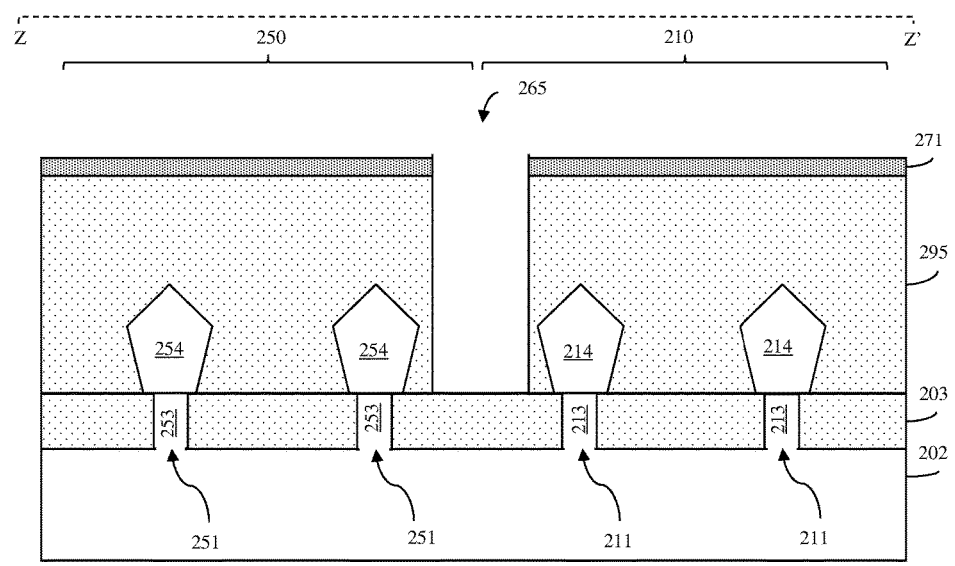
Figure 11A:
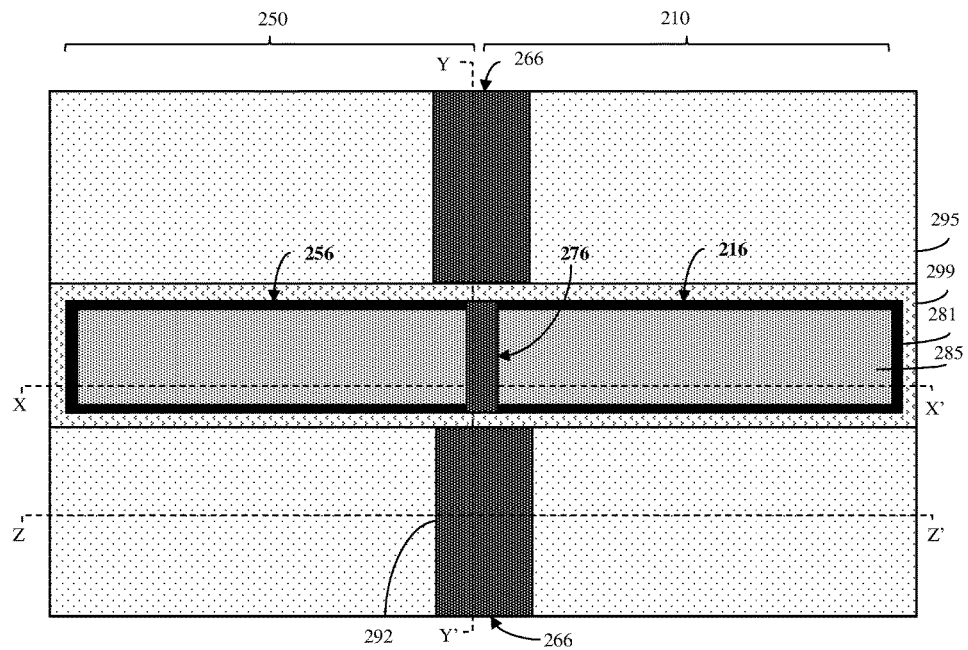
FIG. 11A is a top view diagram and FIGS. 11B-11D are different cross-section diagrams illustrating a partially completed structure formed according to the method of FIG. 1.
Figure 11B:
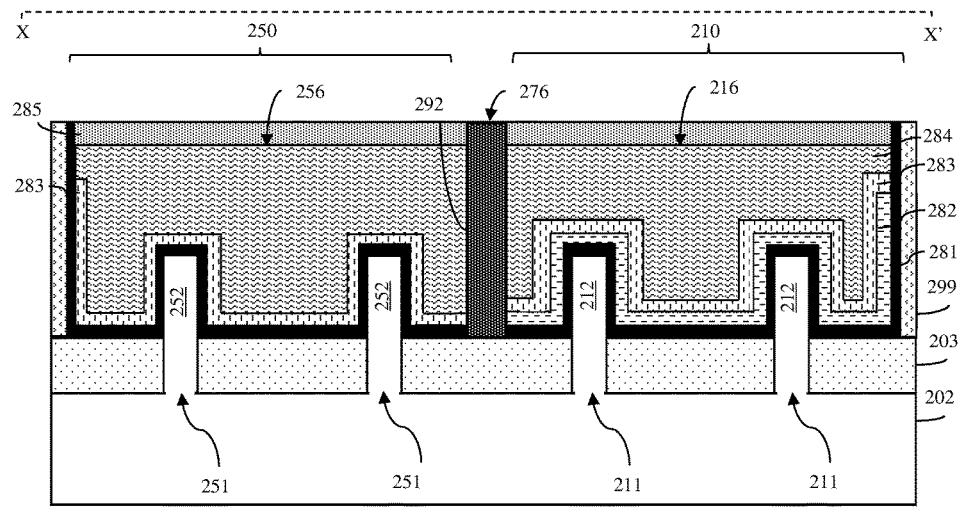
Figure 11C:
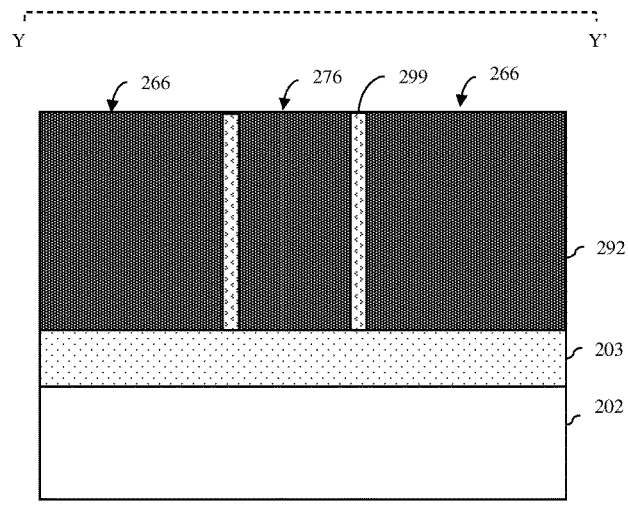
Figure 11D:
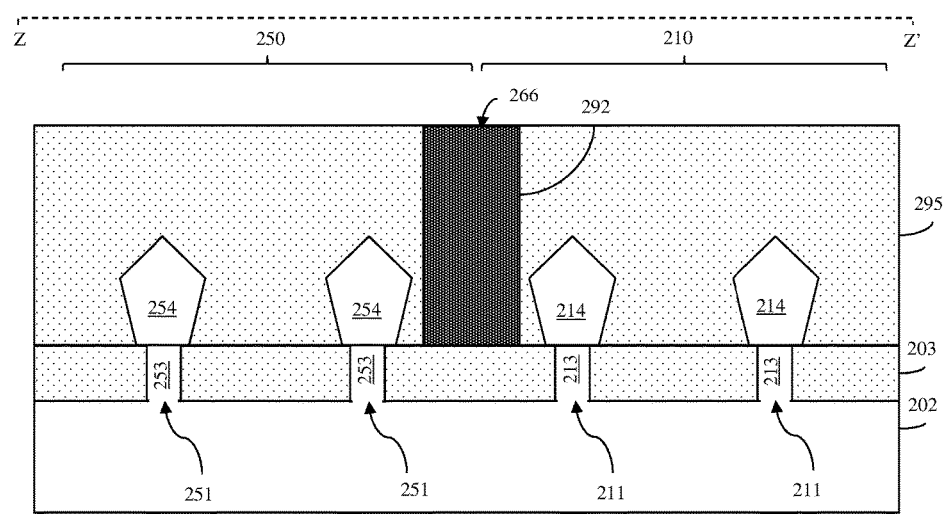

Subsequently, a first trench 275 (referred to above as a gate cut trench) can be formed through the dielectric gate cap 285 and the gate material at an interface between the first RMG 216 and the second RMG 256 (see process 116 and FIGS. 7A-7C). To form the first trench 275, a gate cut patterning stack can be formed over the partially completed structure. This gate cut patterning stack can include, for example, a first hardmask layer 271 (e.g., a silicon nitride hardmask layer) and a second hardmask layer 272 (e.g., a spin-on hardmask layer, such as a spin-on amorphous carbon hardmask layer). A patterning process (e.g., conventional lithographic patterning process) and multiple selective etch processes can then be performed to form a first trench 275 that extends essentially vertically through the hardmask layers 271-272, the dielectric gate cap 285, the conductive fill material 284 and the conformal work functions layers 282-283 to the gate dielectric layer 281 or isolation layer 203 below and that extends laterally at least across the full width of the gate opening 294. Those skilled in the art will recognize that the etch processes will vary depending upon the specific material being etched. The second hardmask layer 272 can then be selectively removed (see FIG. 8).

Next, one or more second trenches 265 (referred to above as contact cut trenches) can be formed, wherein each second trench 265 is formed through a portion of the sacrificial material 295 that fills a space between two adjacent source/drain regions (see process 118 and FIGS. 9A-9D). For purposes of illustration, second trenches 265 are shown in FIGS. 9A-9D on opposing sides of the first trench 275 and physically separated therefrom by portions of the gate sidewall spacer 299. Thus, each second trench illustrated in FIGS. 9A-9D is between a first source/drain region 213 of the first FET and an adjacent second source/drain region 253 of the second FET. It should, however, be understood that the Figures are not intended to be limiting. Depending upon the design and the need to isolate subsequently formed contacts, a single second trench, two second trenches (as shown) or more than two second trenches could be formed. The second trench(es) could be formed on one or both sides of the first and second RMGs 216, 256. Furthermore, one or more of the second trench(es) could be formed between adjacent first and second source/drain regions (as shown), between adjacent first source/drain regions 213 and/or between adjacent second source/drain regions 253. To form the second trench(es) 265, a contact cut patterning stack can be formed over the partially completed structure and, particularly, on the first hardmask layer 271 and in the first trench 275. This gate cut patterning stack can include, for example, a third hardmask layer 261 (e.g., another spin-on hardmask layer, such as a spin-on amorphous carbon hardmask layer). A patterning processes (e.g., a conventional lithographic patterning process) and at least one selective etch processes can then be performed to form second trench(es) 265, which are between adjacent source/drain regions and which extends essentially vertically through the hardmask layers 261 and 271 and through the sacrificial material 295 to the isolation layer 203 below. Again, those skilled in the art will recognize that the etch process(es) used can vary depending upon the material being etched. The third hardmask layer 261 can then be selectively removed (see FIGS. 10A-10D).

Once the first trench 275 and the second trench(es) 265 are formed (i.e., once gate cut trench and the contact cut trench(es) are formed), isolation material 292 can be deposited such that it essentially simultaneously fills both the first trench 275 and the second trench(es) 265 (see process 120 and FIGS. 11A-11D), thereby forming a first isolation region 276 (referred to above as a gate cut isolation region) that electrically isolates the first RMG 216 from the second RMG 256 and second isolation region(s) 266 (referred to above as a contact cut isolation region), respectively. The isolation material 292 can specifically be a dielectric material that is different from the sacrificial material 295 to allow for selective etching of the sacrificial material 295 at process 122 discussed in greater detail below. Optionally, the isolation material 292 can be a low-K dielectric material (i.e., a dielectric material with a dielectric constant (K) that is no greater than 3.9 or the dielectric constant of silicon dioxide) for optimal device performance. For example, the isolation material 292 can be silicon oxycarbide (SiOC). A polishing process (e.g., a chemical mechanical polishing (CMP) process) can then be performed to remove the isolation material 292 from above the first RMG 216 and the second RMG 256. Thus, instead of forming the gate cut trench, filling it with an isolation material, and performing a first polishing process to complete the gate cut isolation region followed by forming the contact cut trench(es), filling it/them with a different isolation material and performing a second polishing process to complete the contact cut isolation region(s), the disclosed method provides for forming the gate cut trench, forming the contact cut trench(es), simultaneously filling the gate cut trench and contact cut trench(es) with the same isolation material, and performing a polishing process to simultaneously complete the gate cut isolation region and the contact cut isolation region(s) and expose the top surfaces of the RMGs. Since the method only requires a single polishing step to complete formation of the gate cut isolation region and the contact cut isolation region (as opposed to a first polishing process to complete the gate cut isolation region and a second polishing process to complete the contact cut isolation region(s)), gate height loss and process variation are minimized.

Additional processing can then be performed in order to complete the IC structure 200 (see FIGS. 12A-12D). This additional processing can include, but is not limited to, selectively removing any remaining sacrificial material 295 adjacent to the first source/drain regions 213 (including any epitaxial portions 214) and the second source/drain regions 213 (including any epitaxial portions 254), thereby creating contact openings, and filling the various contact openings with replacement metal contacts (RMCs) (also referred to as self-aligned contacts) (see process 122). The RMCs can be formed, for example, by optionally depositing one or more conformal layers such as a conformal adhesive layer (e.g., a titanium adhesive layer or other suitable adhesive layer) and/or a conformal barrier layer (e.g., titanium nitride barrier layer or other suitable barrier layer) to line the contact openings and, then, depositing a conductor and, particularly, a metal or metal alloy (e.g., a tungsten, cobalt, aluminum or any other suitable metal plug material) to fill the remaining spaces within the contact openings. Following deposition of the conductor, a polishing process (e.g., a CMP process) can be performed in order to remove any contact material from above the first RMG 216, the second RMG 256, the first isolation region 276 and the second isolation region(s) 266. In any case, the RMCs can include, for example, first RMCs 219a-b contacting the first source/drain regions 213 and, particularly, immediately adjacent to the epitaxial portions 214, if present, and second RMCs 259a-b contacting the second source/drain regions 253 and, particularly, immediately adjacent to the epitaxial portions 254, if present. As illustrated, a second isolation region 266 can be positioned laterally between each pair of adjacent RMCs on a given side of the gates such that the adjacent RMCs are electrically isolated from each other by the second isolation region 266. For example, see second isolation regions 266 between first RMC 219a and second RMC 259a and further between first RMC 219b and second RMC 259b.

Figure 13:
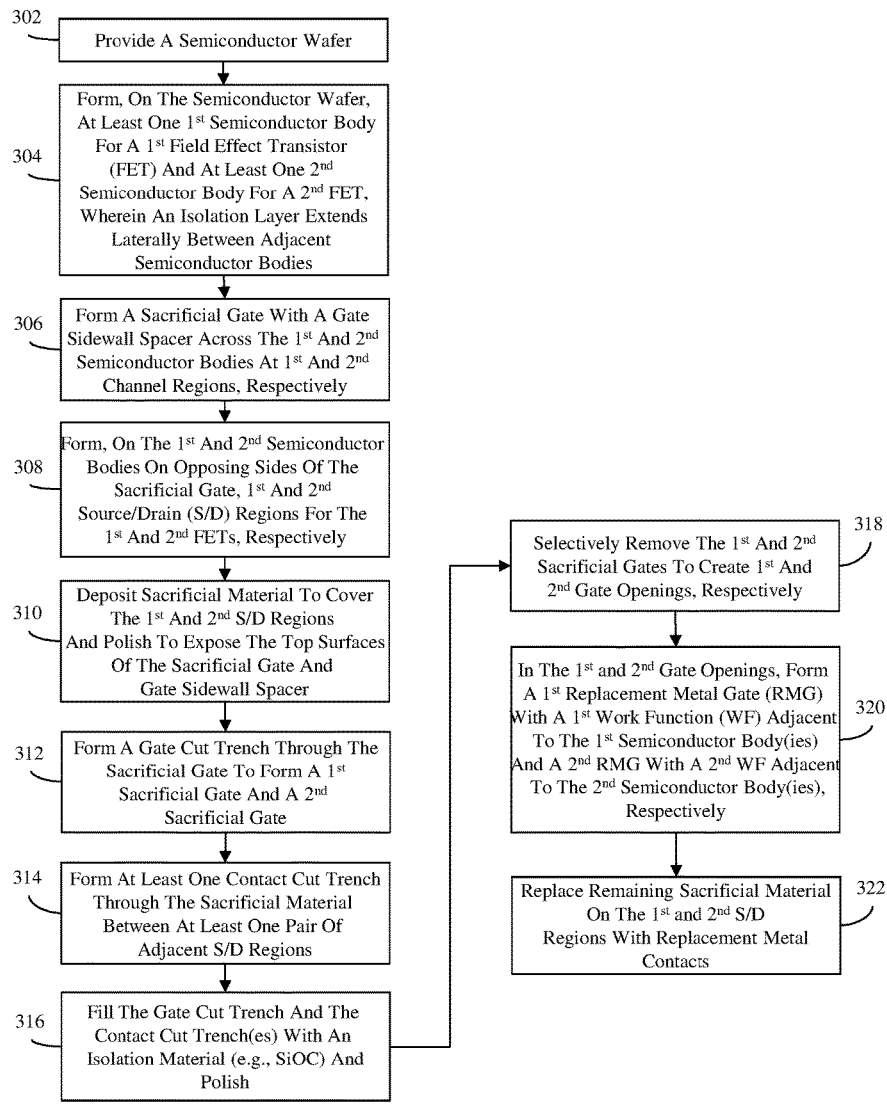
FIG. 13 is a flow diagram illustrating a method of forming an integrated circuit (IC) structure.

FIG. 13 is a flow diagram illustrating another embodiment of the method, which includes formation of the above-mentioned trenches at the polysilicon open chemical mechanical polishing (POC) process level.

Figure 14A:
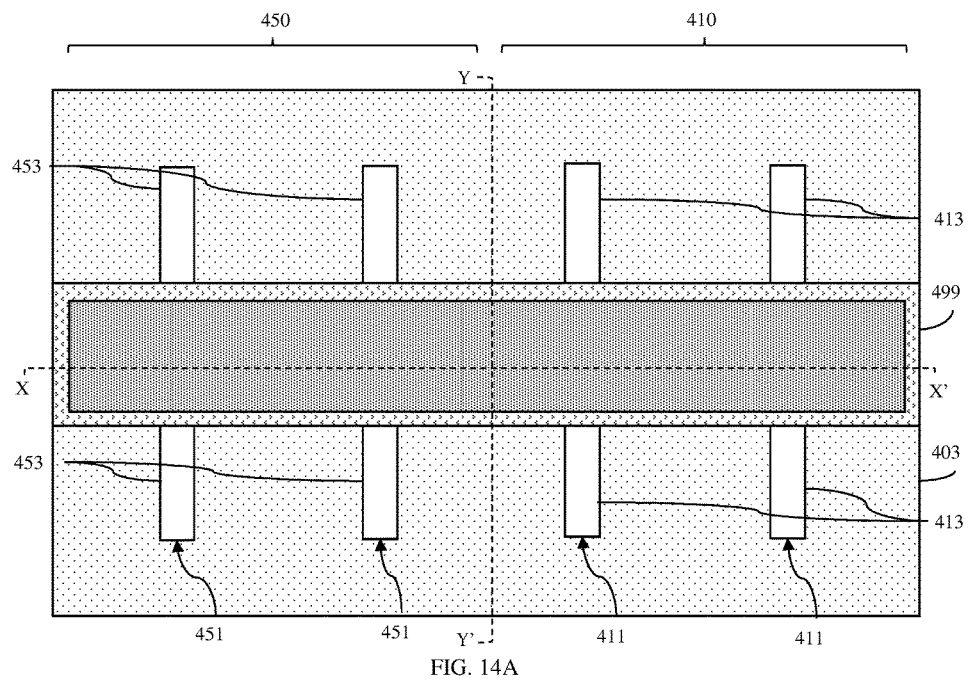
FIG. 14A is a top view diagram and FIGS. 14B-14C are different cross-section diagrams illustrating a partially completed structure formed according to the method of FIG. 13.
Figure 14B:
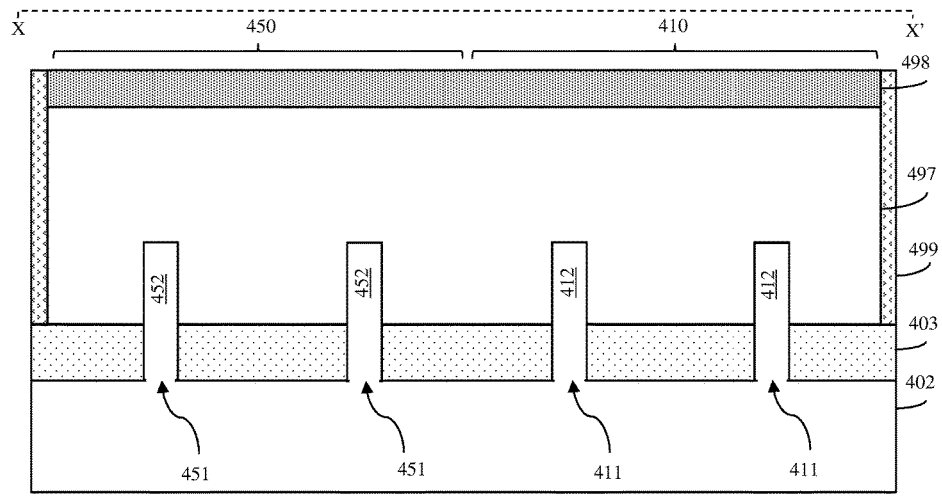

Specifically, this embodiment of the method includes providing a semiconductor wafer (see process 302) and forming a plurality of essentially parallel semiconductor bodies for a plurality of field effect transistors (FETs) on the semiconductor wafer (see process 304). The semiconductor wafer provided at process 302 can be, for example, a bulk semiconductor wafer 402 (e.g., a bulk silicon wafer or other suitable bulk semiconductor wafer), as illustrated in FIGS. 14A-14B. Alternatively, a semiconductor-on-insulator wafer (e.g., a silicon-on-insulator (SOI) wafer) could be used.

The parallel semiconductor bodies formed at process 304 can include one or more first semiconductor bodies 411 for a first FET 410 having a first-type conductivity (e.g., a P-type FET) in a first device region and one or more second semiconductor bodies 451 for a second FET 450 having a second-type conductivity (e.g., an N-type FET) in a second device region, as shown in FIGS. 14A-14B.

As illustrated, the semiconductor bodies 411, 451 can be non-planar semiconductor bodies (e.g., semiconductor fins) for non-planar field effect transistors (e.g., fin-type field effect transistors (FINFETs)). For purposes of this disclosure, a semiconductor fin refers to a relatively tall and thin, elongated, rectangular-shaped, semiconductor body. Additionally, for purposes of illustration, two first semiconductor fins 411 and two second semiconductor fins 451 are shown. However, it should be understood that the figures are not intended to be limiting and that one or more first semiconductor fins and one or more second semiconductor fins could, alternatively, be formed. Techniques for forming such semiconductor fins (e.g., lithographic patterning techniques, sidewall image transfer techniques, replacement fin techniques, etc.) are well known in the art and, thus, the details have been omitted from this specification in order to allow the reader to focus on the salient aspects of the disclosed method. Alternatively, the semiconductor bodies 411, 451 could be formed as planar semiconductor bodies for planar FETs (not illustrated). Such planar semiconductor bodies can be formed, for example, by forming shallow trench isolation (STI) regions in the semiconductor wafer to define the planar semiconductor bodies. Techniques for forming such STI regions to define planar semiconductor bodies in a semiconductor wafer are well known in the art and, thus, the details have been omitted from this specification in order to allow the reader to focus on the salient aspects of the disclosed method.

In any case, by design, each semiconductor body 411, 451 will have designated areas for source/drain regions 413, 453 and a channel region 412, 452 positioned laterally between the source/drain regions 413, 453. For example, the first semiconductor body(ies) 411 will have a first channel region 412 positioned laterally between first source/drain regions 413 and the second semiconductor body(ies) 451 will have a second channel region 452 positioned laterally between second source/drain regions 453. Optionally, each semiconductor body 411, 451 can be doped, either before or after formation, so that its channel region has appropriate type conductivity at a relatively low conductivity level. For example, for a P-type FET, each channel region can have an N− conductivity; whereas, for an N-type FET, each channel region can have a P− conductivity.

It should be noted that, in the case of FINFETs, if the semiconductor wafer on which the semiconductor fins 411, 451 are formed at process 304 is a bulk semiconductor wafer 402, as shown, an isolation layer 403 can be formed around the lower portion of each semiconductor body 411, 451 and can extend laterally between adjacent semiconductor fins 411, 451. For example, silicon oxide can be deposited over the semiconductor fins 411, 451 and recessed to form an isolation layer 403. If, however, the semiconductor wafer on which the semiconductor fins 411, 451 are formed at process 304 is an SOI wafer, the semiconductor fins 411, 451 can extend essentially vertically upward from the top surface of an insulator layer such that portions of the insulator layer function as an isolation layer extending laterally between adjacent semiconductor fins.

Figure 14C:
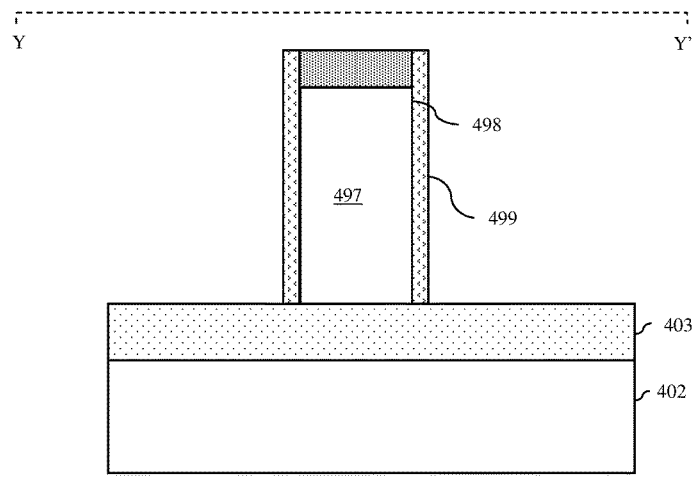

A sacrificial gate 497 (also referred to as a dummy gate) with a sacrificial gate cap 498 and a dielectric gate sidewall spacer 499 can be formed adjacent to each semiconductor body 411, 451 at the channel region 412, 452 (see process 306 and FIGS. 14A-14C). For example, a sacrificial gate 497 can be formed such that it is on a first top surface and first opposing sides of each first semiconductor body 411 at the first channel region 412 and such that it is on a second top surface and second opposing sides of the each second semiconductor body 451 at the second channel region 452. To form such a sacrificial gate 497, a blanket first sacrificial layer (e.g., a thin gate oxide, followed by a sacrificial polysilicon layer or a sacrificial amorphous silicon layer) can be formed above and adjacent to the opposing sides of each semiconductor body 411, 451. A polishing process (e.g., a chemical mechanical polishing (CMP) process) can be performed to ensure that the top surface of the first sacrificial layer is essentially planar. Then, a second sacrificial layer (e.g., a sacrificial nitride layer, a silicon boron carbon nitride layer or other suitable dielectric layer), which is different from the first sacrificial layer, can be formed on the top surface of the first sacrificial layer. The first and second sacrificial layers can then be lithographically patterned and etched to form the sacrificial gate 497 with a sacrificial gate cap 498.

A gate sidewall spacer 499 can then be formed on the sidewalls of the sacrificial gate 497 such that it laterally surrounds and is immediately adjacent to the sacrificial gate 497. The gate sidewall spacer 499 can be formed, for example, using conventional sidewall spacer formation techniques. Such sidewall spacer formation techniques are well known in the art and, thus, the details of those techniques have been omitted from the specification in order to allow the reader to focus on the salient aspects of the disclosed method. In any case, the gate sidewall spacer 499 can be made of silicon nitride, silicon carbon nitride, silicon boron carbon nitride or any other suitable gate sidewall spacer material that is different from the material used for the sacrificial gate 497.

Figure 15:
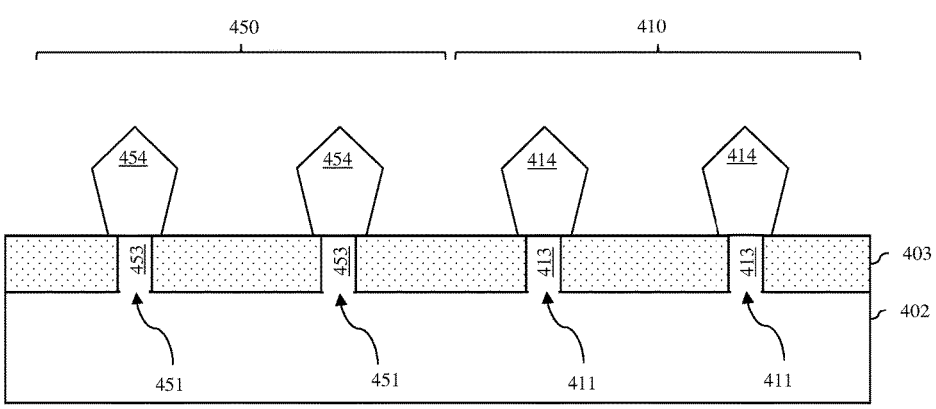
FIG. 15 is a cross-section diagram illustrating a partially completed structure formed according to the method of FIG. 13.
Figure 16A:
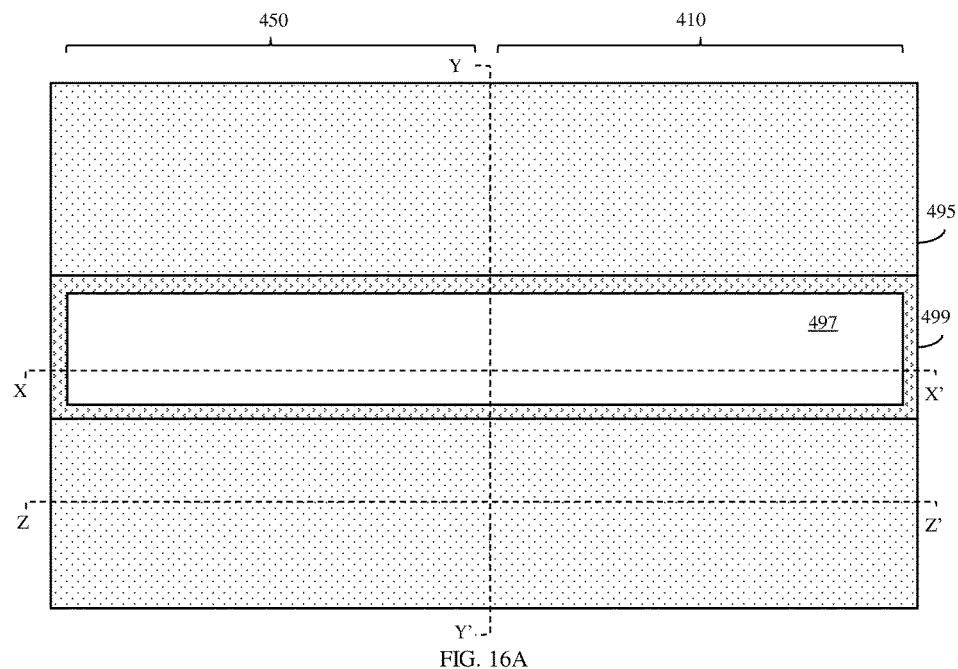
FIG. 16A is a top view diagram and FIGS. 16B-16D are different cross-section diagrams illustrating a partially completed structure formed according to the method of FIG. 13.
Figure 16B:
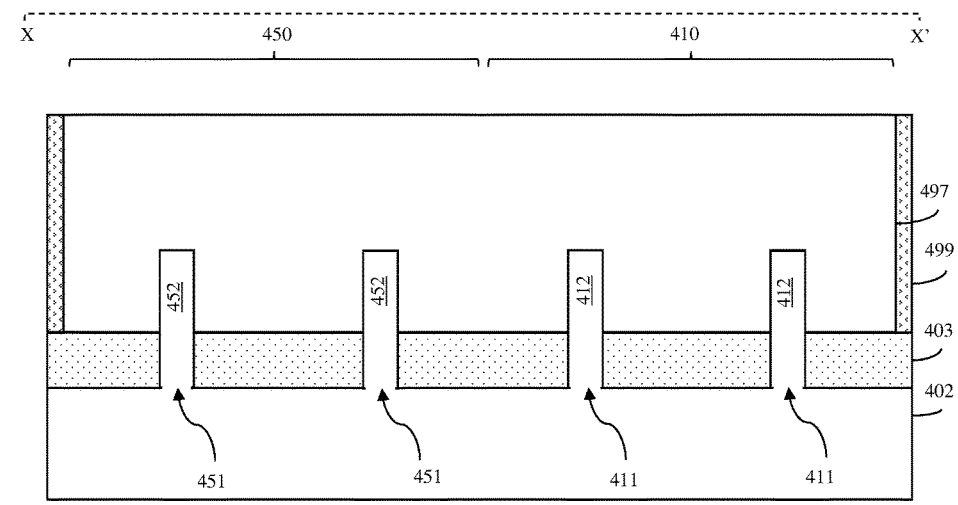
Figure 16C:
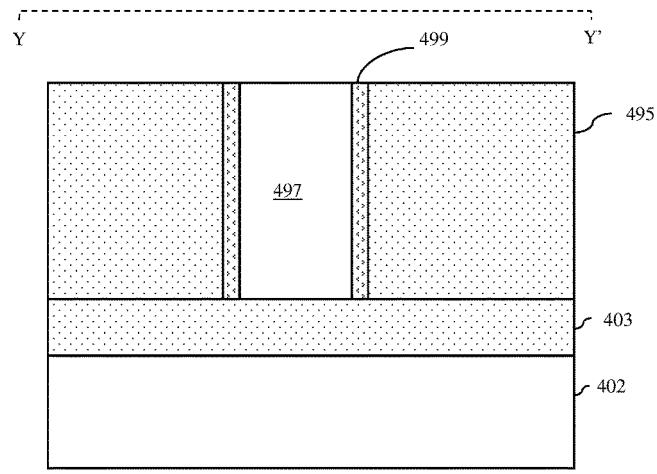
Figure 16D:
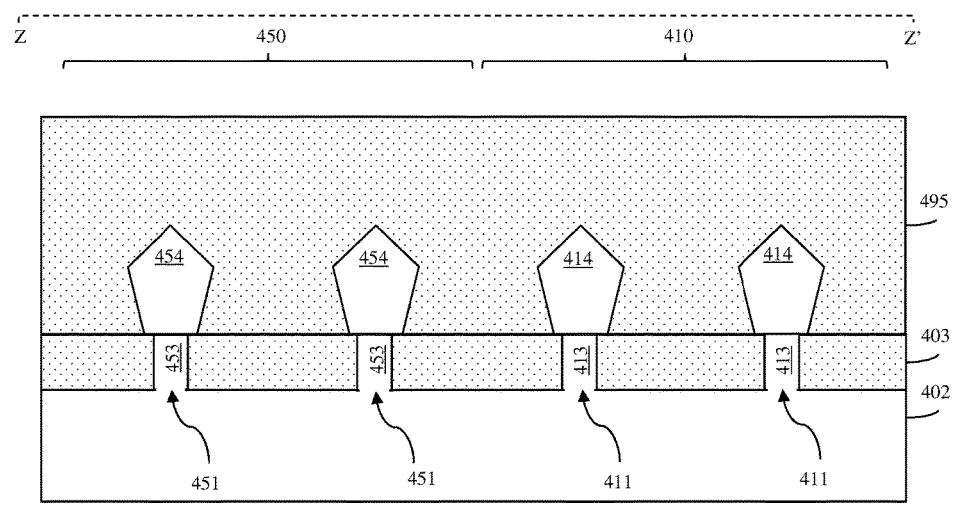

Source/drain regions 413, 453 for the different FETs 410, 450 can be formed using exposed portions of the semiconductor bodies 411, 451 that extend laterally beyond the sacrificial gate 497 and gate sidewall spacer 499 (see process 308). For example, a masked dopant implantation process can be performed to dope the first source/drain regions 413 of the first FET 410, which will have the first-type conductivity, with a first dopant so that they have the first-type conductivity at a relatively high conductivity level (e.g., P+ conductivity for a P-type FET). Another masked dopant implantation process can be performed to dope the second source/drain regions 453 of the second FET 450, which will have the second-type conductivity, with a second dopant so that they have the second-type conductivity at a relatively high conductivity level (e.g., N+ conductivity for an N-type FET). Additionally or alternatively, epitaxial semiconductor material can be deposited on the exposed portions of the semiconductor bodies 411, 451 that extend laterally beyond the sacrificial gate 497 and the gate sidewall spacer 499 to form first epitaxial portions 414 of the first source/drain regions 413 and second epitaxial portions 454 of the second source/drain regions 453 (see FIG. 15). The epitaxial semiconductor material can be in-situ doped or subsequently implanted to achieve the desired conductivity. Optionally, recesses can be formed in the source/drain regions 413, 453 of each semiconductor bodies 411, 451 prior to deposition of epitaxial semiconductor material.

It should be noted that the epitaxial semiconductor material, described above, may be the same semiconductor material as that used for the semiconductor bodies (e.g., silicon). Alternatively, this epitaxial semiconductor material can be preselected for optimal device performance. For example, for a P-type FET, the epitaxial semiconductor material 414 could be silicon germanium (SiGe), which will enhance majority charge carrier mobility within the P-type FET's channel region and, thereby enhance performance. For an N-type FET, the epitaxial semiconductor material 454 could be silicon carbide (SiC), which will enhance majority charge carrier mobility within the N-type FET's channel region and, thereby enhance performance.

Subsequently, sacrificial material 495 can be deposited over the partially completed structure (see process 310 and FIGS. 16A-16D). The sacrificial material 495 can include a single sacrificial material layer (e.g., a single layer of silicon oxide or some other suitable interlayer dielectric (ILD) material, such as borophosphosilicate glass (BPSG), tetraethyl orthosilicate (TEOS), fluorinated tetraethyl orthosilicate (FTEOS), etc.). Alternatively, the sacrificial material 495 can include multiple sacrificial material layers (e.g., a sacrificial polysilicon layer, a sacrificial dielectric layer, etc.). In any case, the sacrificial material 495 should be different from the dielectric material of the gate sidewall spacer 499 to allow for subsequent selective etching of the sacrificial material 495 at process 322 discussed in greater detail below. As illustrated, the sacrificial material 495 can cover the first source/drain regions 413 (including the first epitaxial portion 414, if present) and the second source/drain regions 453 (including the second epitaxial portion 454, if present) and can further fill the spaces between adjacent source/drain regions. Next, a polishing process (e.g., a chemical mechanical polishing (CMP) process) can be performed in order to expose the top surface of the sacrificial gate 497, as shown.

Figure 17A:
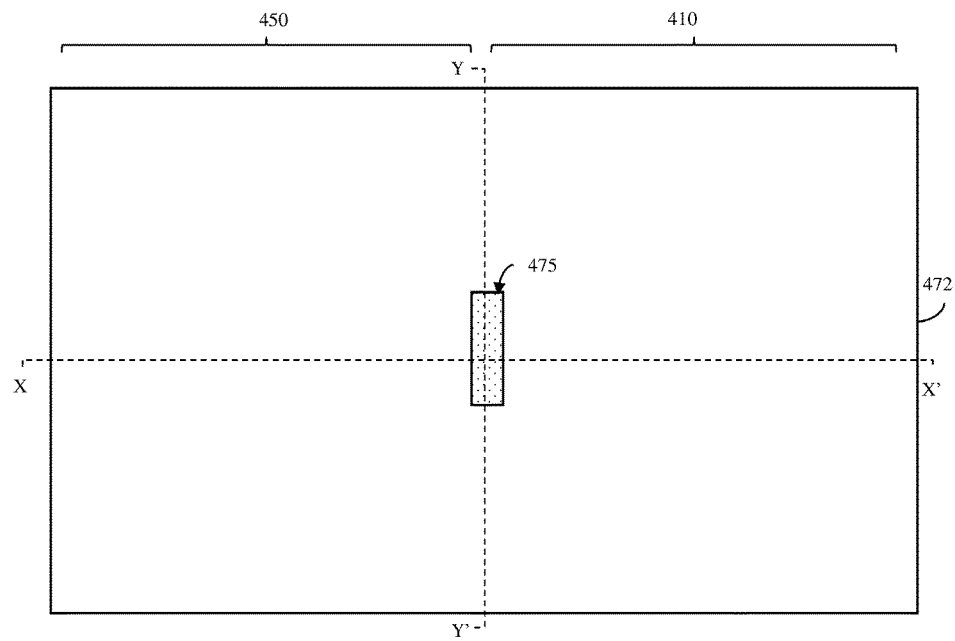
FIG. 17A is a top view diagram and FIGS. 17B-17C are different cross-section diagrams illustrating a partially completed structure formed according to the method of FIG. 13.
Figure 17B:
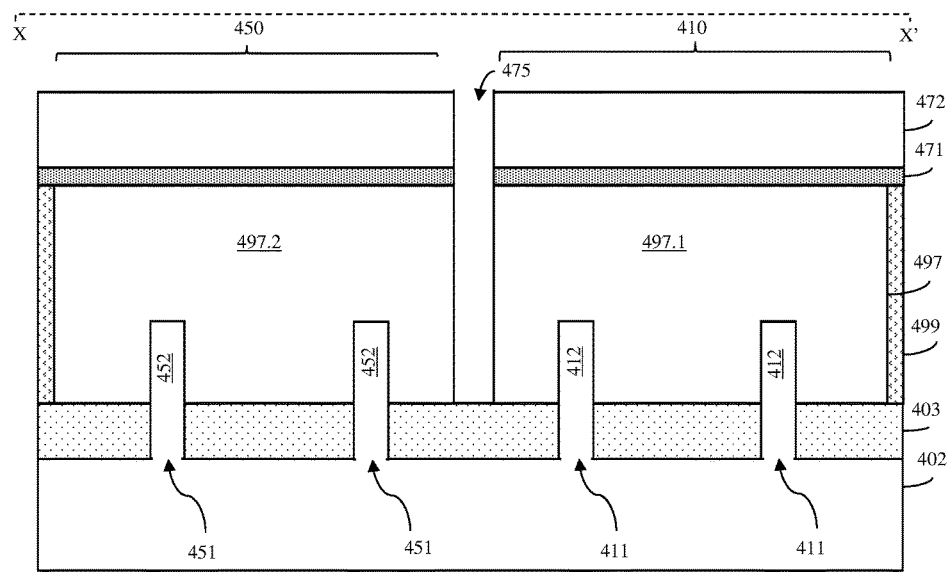
Figure 17C:
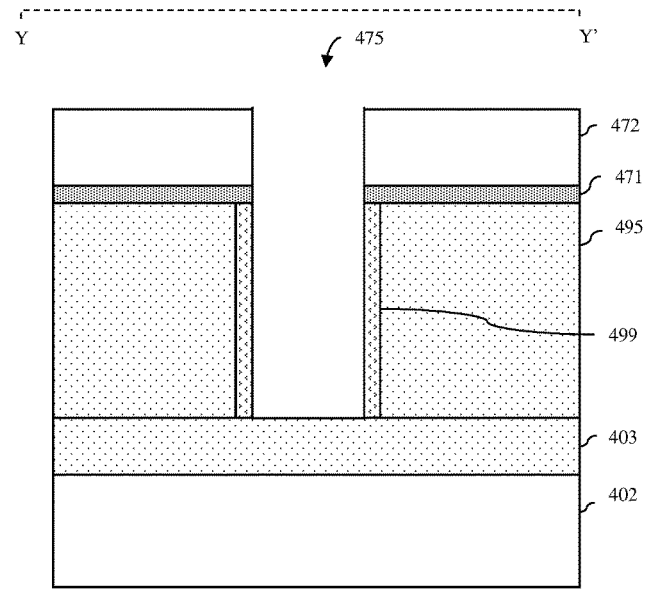
Figure 18:
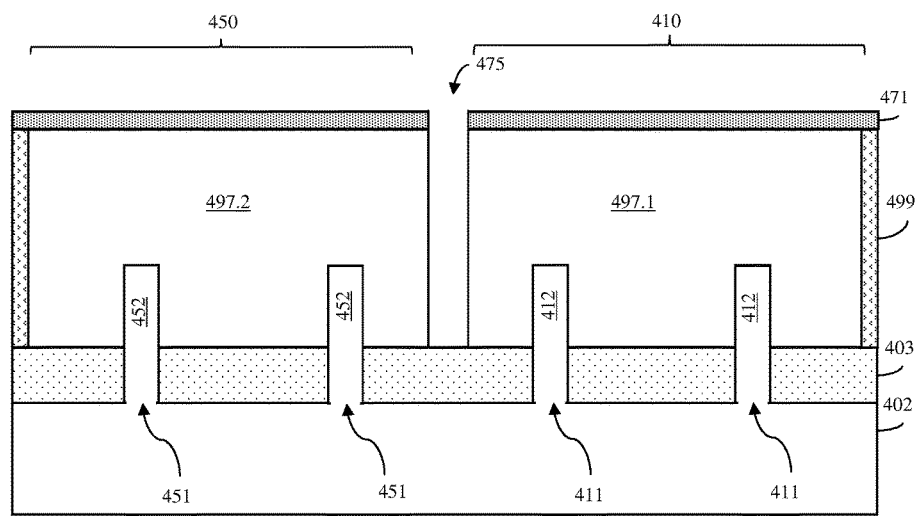
FIG. 18 is a cross-section diagram illustrating a partially completed structure formed according to the method of FIG. 13.
Figure 19A:
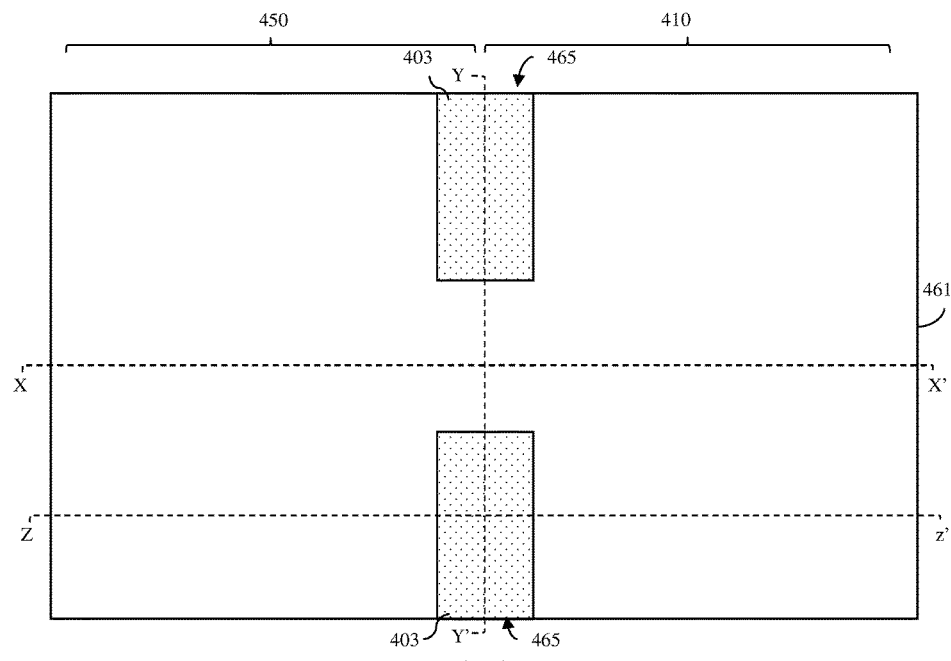
FIG. 19A is a top view diagram and FIGS. 19B-19D are different cross-section diagrams illustrating a partially completed structure formed according to the method of FIG. 13.
Figure 19B:
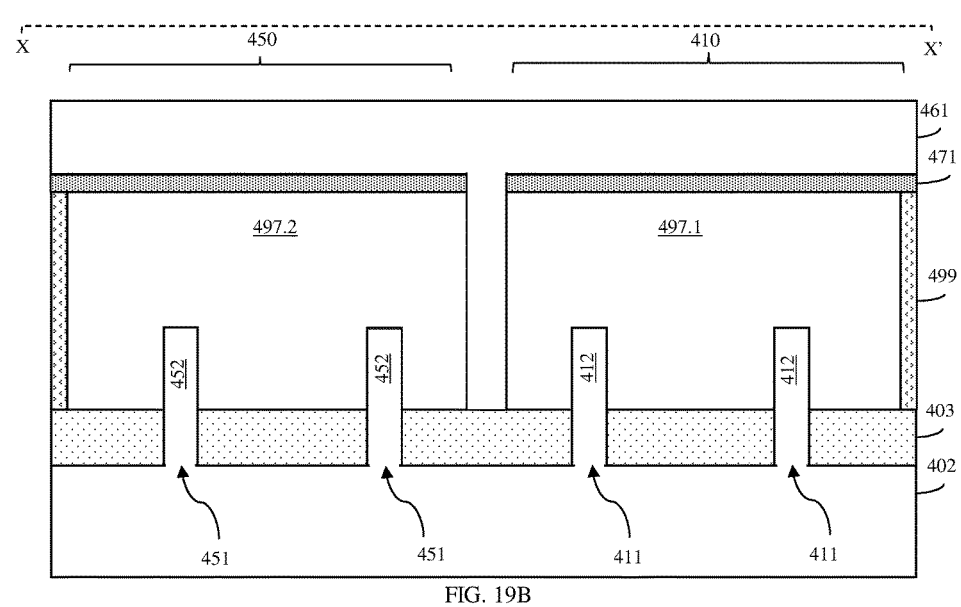
Figure 19C:
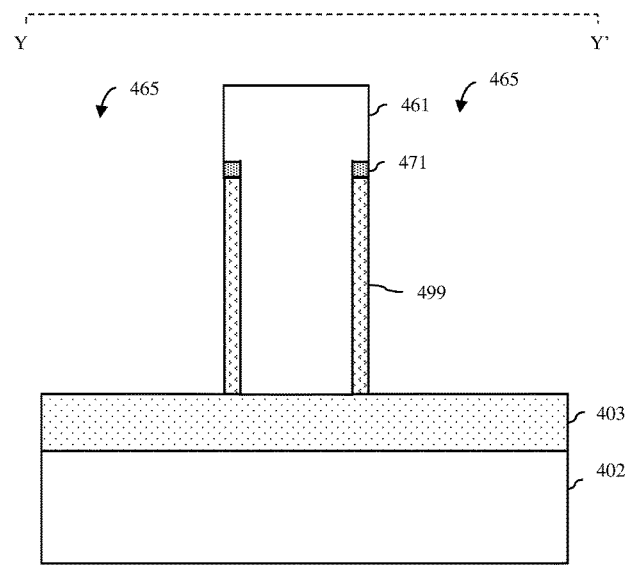
Figure 19D:
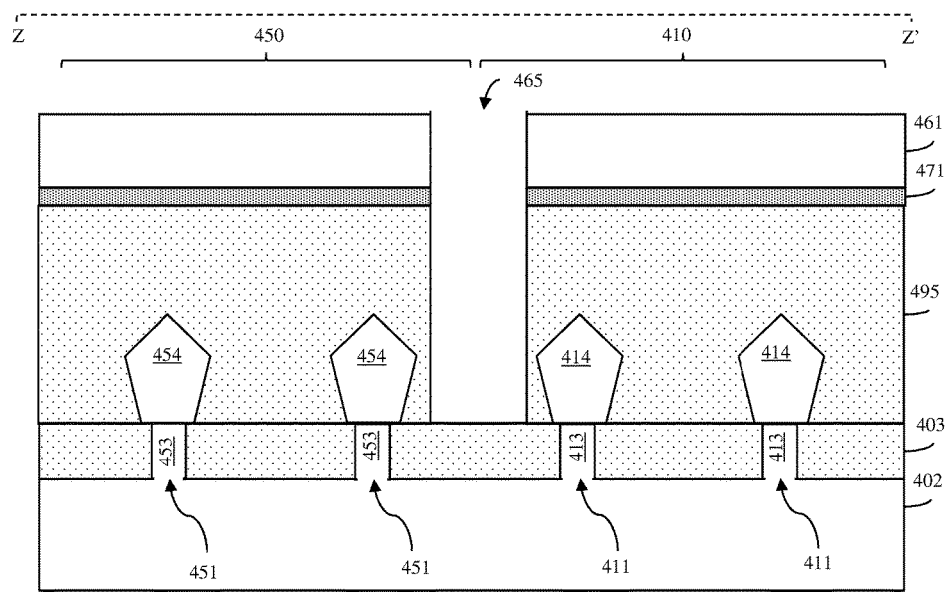
Figure 20A:
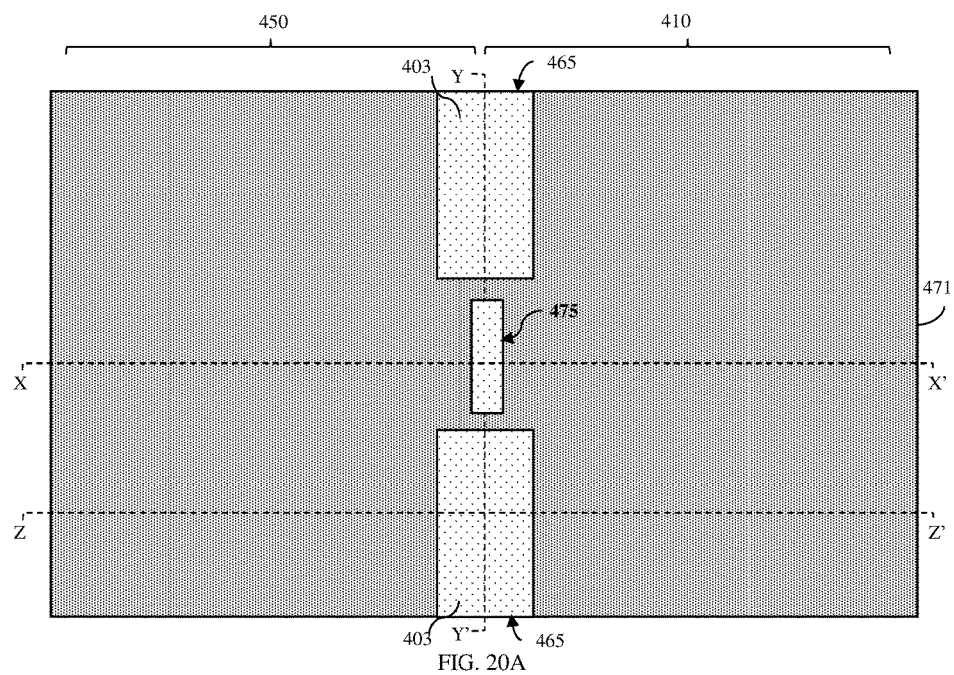
FIG. 20A is a top view diagram and FIGS. 20B-20D are different cross-section diagrams illustrating a partially completed structure formed according to the method of FIG. 13.
Figure 20B:
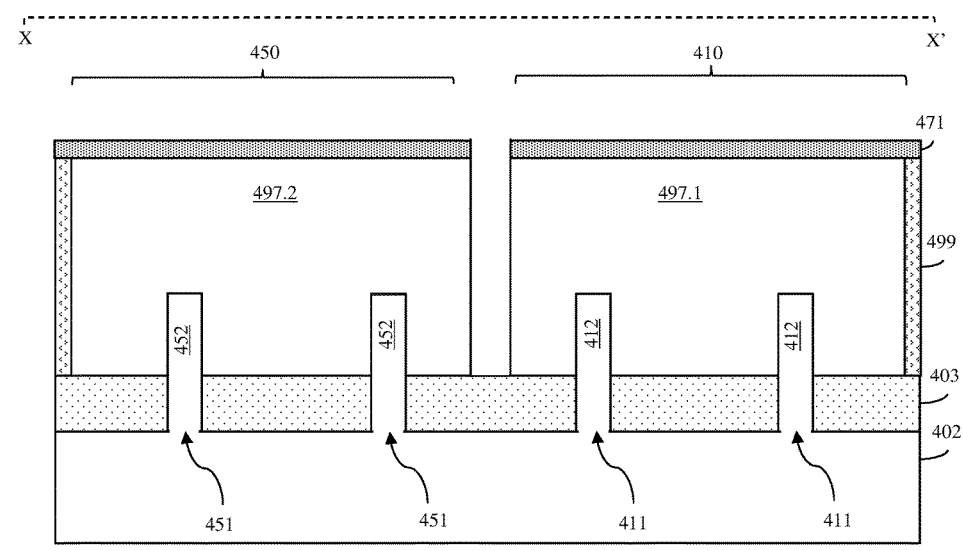
Figure 20C:
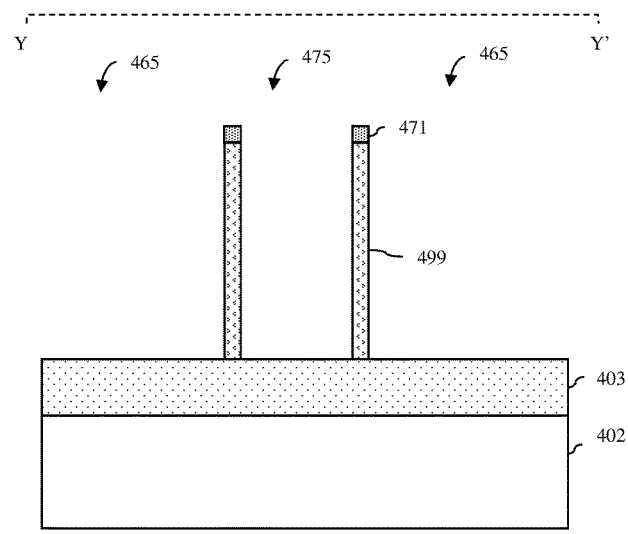
Figure 20D:
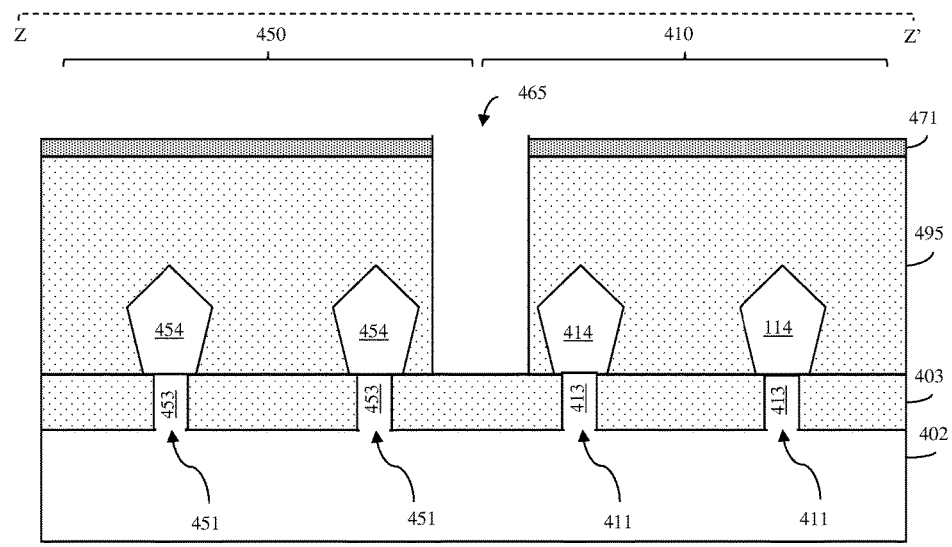
Figure 21A:
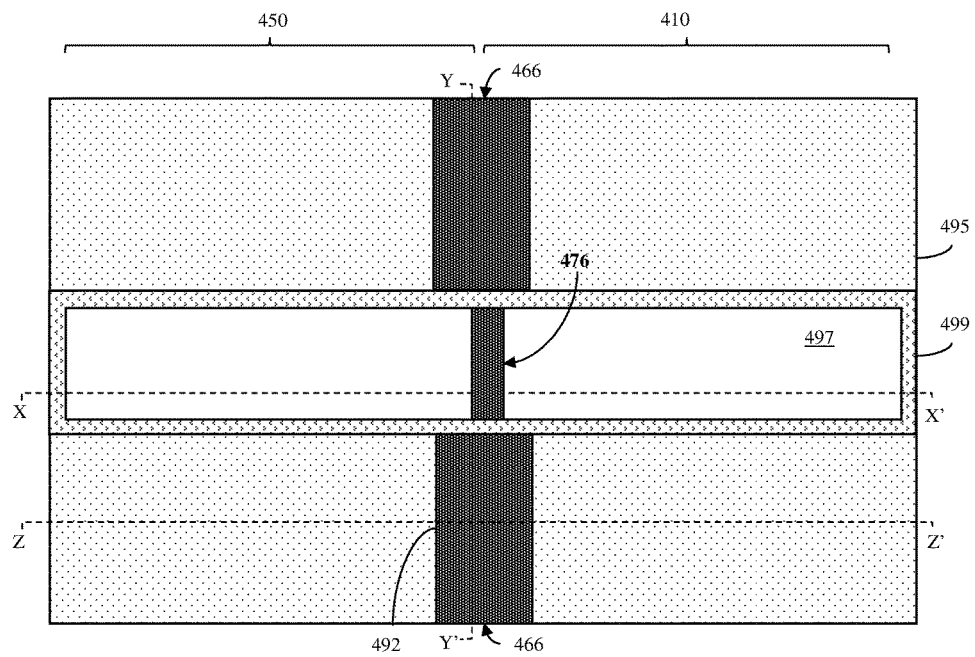
FIG. 21A is a top view diagram and FIGS. 21B-21D are different cross-section diagrams illustrating a partially completed structure formed according to the method of FIG. 13.
Figure 21B:
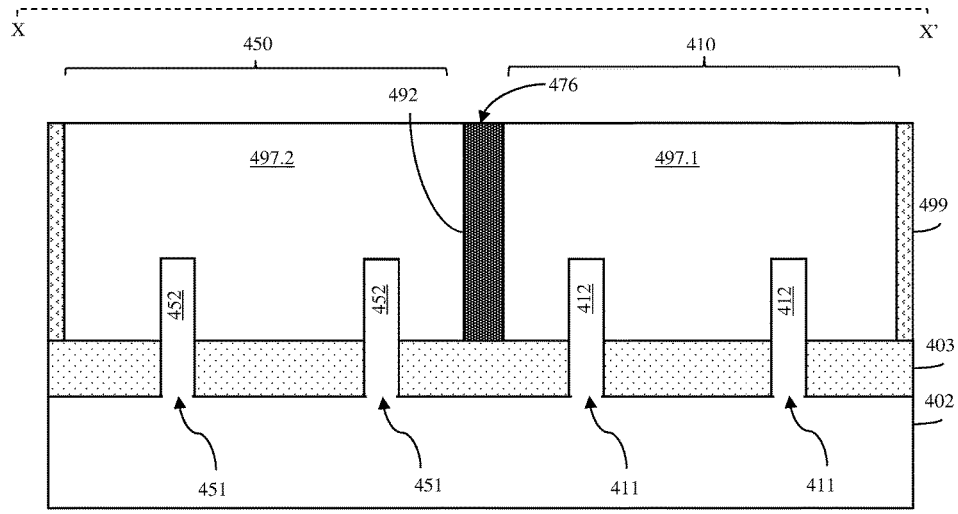
Figure 21C:
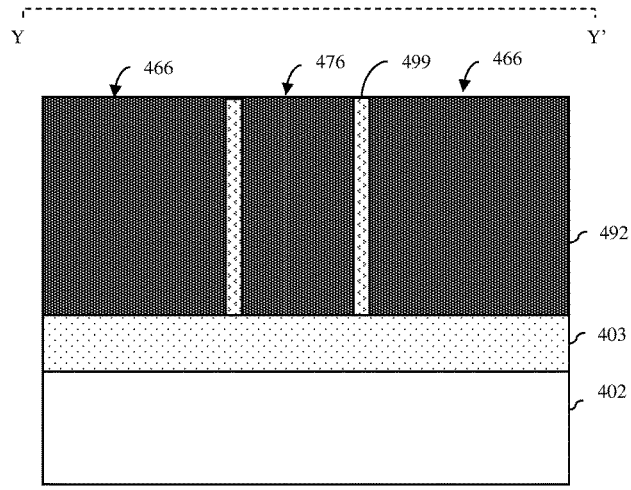
Figure 21D:
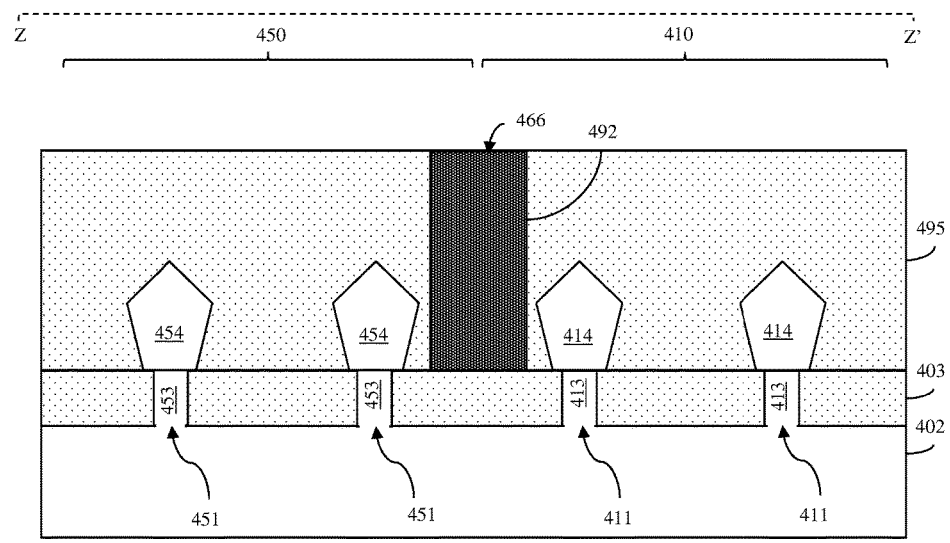
Figure 22:
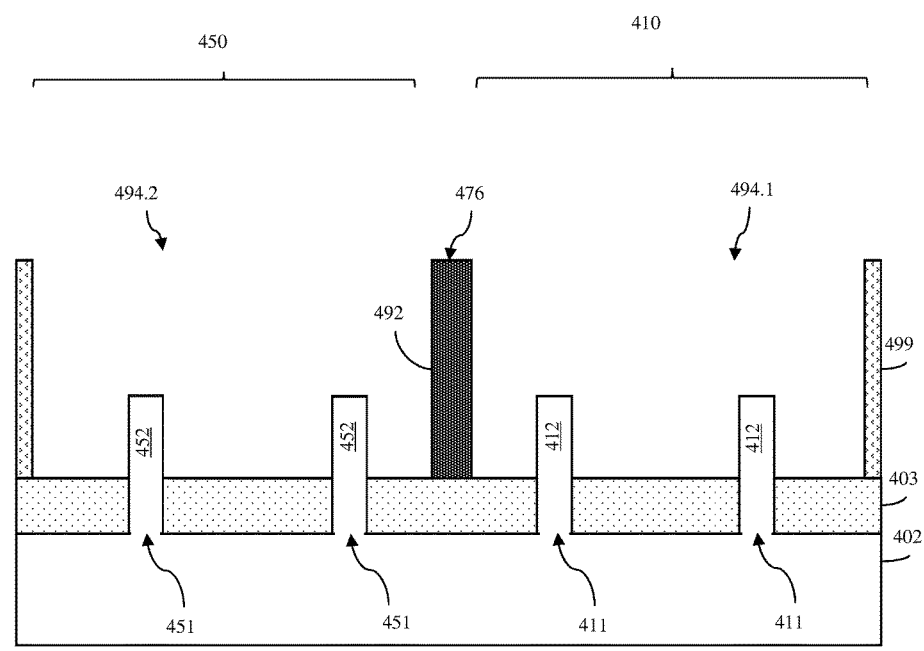
FIG. 22 is a cross-section diagram illustrating a partially completed structure formed according to the method of FIG. 13.

Subsequently, a first trench 475 (referred to above as a gate cut trench) can be formed through the sacrificial gate 497 in an area between the first device region and the second device region (see process 312 and FIGS. 17A-17C). To form the first trench 475, a gate cut patterning stack can be formed over the partially completed structure. This gate cut patterning stack can include, for example, a first hardmask layer 471 (e.g., a silicon nitride hardmask layer) and a second hardmask layer 472 (e.g., a spin-on hardmask layer, such as a spin-on amorphous carbon hardmask layer). A patterning process (e.g., conventional lithographic patterning process) and at least one selective etch process can then be performed to form a first trench 475, which extends essentially vertically through the hardmask layers 471-472 and the sacrificial gate 497 to the isolation layer 403 below and which further extends laterally at least across the full width of the sacrificial gate to gate sidewall spacer 499, thereby dividing the sacrificial gate 497 into a first sacrificial gate 497.1 and a second sacrificial gate 497.2. Those skilled in the art will recognize that the etch processes will vary depending upon the specific material being etched. The second hardmask layer 472 can then be selectively removed (see FIG. 18).

Next, one or more second trenches 465 (referred to above as contact cut trenches) can be formed, wherein each second trench 465 is formed through a portion of the sacrificial material 495 that fills a space between two adjacent source/drain regions (see process 314 and FIGS. 19A-19D). For purposes of illustration, second trenches 465 are shown in FIGS. 19A-19D on opposing sides of the first trench 475 and physically separated therefrom by portions of the gate sidewall spacer 499. Thus, each second trench illustrated in FIGS. 19A-19D is between a first source/drain region 413 of the first FET and an adjacent second source/drain region 453 of the second FET. It should, however, be understood that the Figures are not intended to be limiting. Depending upon the design and the need to isolate subsequently formed contacts, a single second trench, two second trenches (as shown) or more than two second trenches could be formed. The second trench(es) could be formed on one or both sides of the first and second RMGs 416 and 456. Furthermore, one or more of the second trench(es) could be formed between adjacent first and second source/drain regions (as shown), between adjacent first source/drain regions 413 and/or between adjacent second source/drain regions 453. To form the second trench(es) 465, a contact cut patterning stack can be formed over the partially completed structure and, particularly, on the first hardmask layer 471 and in the first trench 475. This gate cut patterning stack can include, for example, a third hardmask layer 461 (e.g., another spin-on hardmask layer, such as a spin-on amorphous carbon hardmask layer). A patterning process (e.g., conventional lithographic patterning process) and at least one selective etch process can be performed to form second trench(es) 475, which are between adjacent source/drain regions and which extends essentially vertically through the hardmask layers 461 and 471 and through the sacrificial material 495 to the isolation layer 403 below. Again, those skilled in the art will recognize that the etch processes will vary depending upon the specific material being etched. The third hardmask layer 461 can then be selectively removed (see FIGS. 20A-20D).

Once the first trench 475 and the second trench(es) 465 are formed (i.e., one the gate cut trench and the contact cut trench(es) are formed), isolation material 492 can be deposited such that it essentially simultaneously fills both the first trench 475 and the second trench(es) 465 (see process 316 and FIGS. 21A-21D), thereby forming a first isolation region 476 (referred to above as a gate cut isolation region) between the first sacrificial gate 497.1 and the second sacrificial gate 497.2 and second isolation region(s) 466 (referred to above as a contact cut isolation region), respectively. The isolation material 492 can specifically be a dielectric material that is different from the sacrificial material 495 to allow for selective etching of the sacrificial material 495 at process 322 discussed in greater detail below. Optionally, the isolation material 492 can be a low-K dielectric material (i.e., a dielectric material with a dielectric constant (K) that is no greater than 3.9 or the dielectric constant of silicon dioxide) for optimal device performance. For example, the isolation material 492 can be silicon oxycarbide (SiOC). A polishing process (e.g., a chemical mechanical polishing (CMP) process) can then be performed to remove the isolation material 492 from above the first and second sacrificial gates 497.1-497.2. Thus, instead of forming the gate cut trench, filling it with an isolation material, and performing a first polishing process to complete the gate cut isolation region followed by forming the contact cut trench(es), filling it/them with a different isolation material and performing a second polishing process to complete the contact cut isolation region(s), the disclosed method provides for forming the gate cut trench, forming the contact cut trench(es), simultaneously filling the gate cut trench and contact cut trench(es) with the same isolation material, and performing a polishing process to simultaneously complete the gate cut isolation region and the contact cut isolation region(s) and expose the top surfaces of the sacrificial gates. Since the method only requires a single polishing step to complete formation of the gate cut isolation region and the contact cut isolation region (as opposed to a first polishing process to complete the gate cut isolation region and a second polishing process to complete the contact cut isolation region(s)), gate height loss and process variation are minimized.

Additional processing can then be performed to complete the IC structure 400 (see processes 318-322 and FIG. 22-FIGS. 24A-24D). This additional processing can include, but is not limited to, selectively removing (e.g., using a selective etch process) the first sacrificial gate 497.1 and the second sacrificial gate 497.2 to create a first gate opening 494.1, which exposes the first channel region 412 of each first semiconductor body 411, and a second gate opening 494.2, which exposes the second channel region 452 of each second semiconductor body 451, respectively (see process 318 and FIG. 22). Techniques for formation and subsequent selective removal of sacrificial gates are well known in the art and, thus, the details of those techniques have been omitted form this specification in order to allow the readers to focus on the salient aspects of the disclosed methods. It should be noted that the selective etch process used to remove the sacrificial gates should be selective for the material of the sacrificial gates 497.1-497.2 over the materials of the semiconductor bodies 411, 451, the sacrificial material 495, and the gate sidewall spacer 499.

Figure 23A:
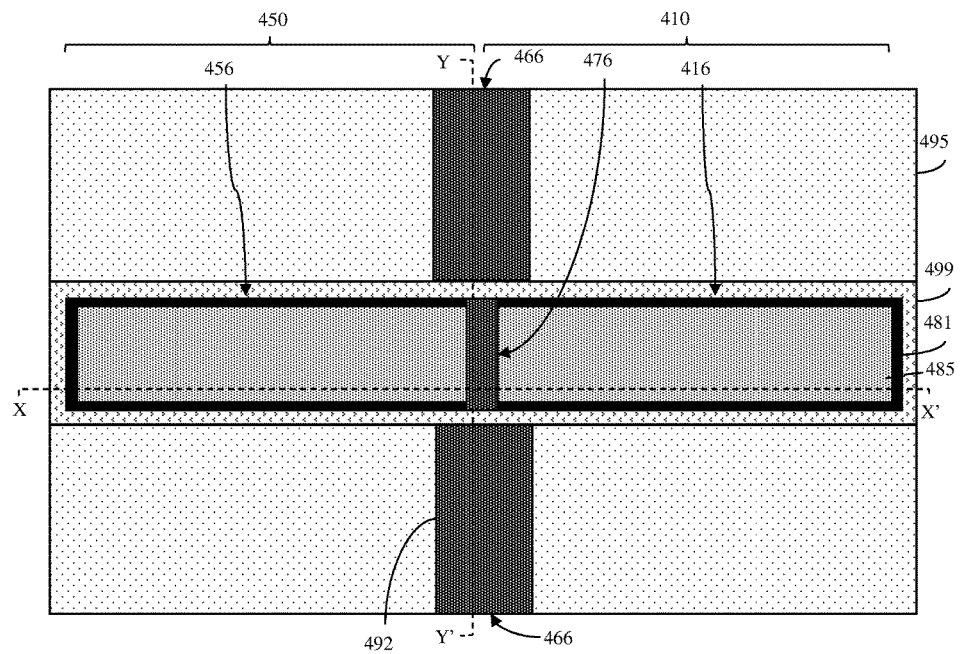
FIG. 23A is a top view diagram and FIG. 23B is a cross-section diagram illustrating a partially completed structure formed according to the method of FIG. 13.
Figure 23B:
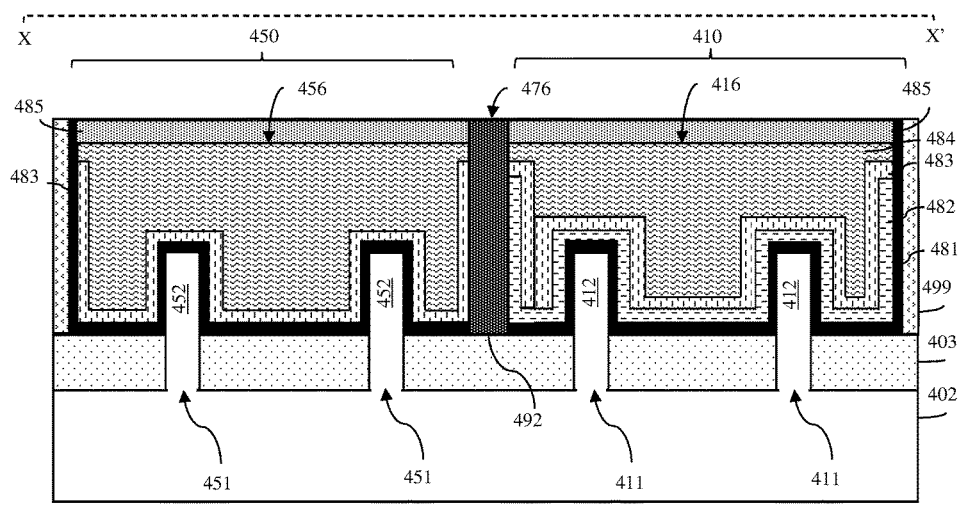

Various gate materials can be deposited into the first gate opening 494.1 and the second gate opening 494.2 and patterned in order to form a first replacement metal gate (RMG) 416 in the first gate opening 494.1 adjacent to the exposed first channel region 412 of each first semiconductor body 411 and a second RMG 456 in the second gate opening 494.2 adjacent to the exposed second channel region 452 of each second semiconductor body 450 (see process 320 and FIGS. 23A-23B).

For example, to form the first RMG 416 in the first gate opening 494.1 and the second RMG 456 in the second gate opening 494.2, a gate dielectric layer 481 and, particularly, a high-K gate dielectric layer can be conformally deposited in the gate openings 494.1-494.2. Subsequently, a first work function metal layer 482 can be conformally over the gate dielectric layer 481. The metal material or metal alloy material of the conformal first work function metal layer 482 can be preselected in order to achieve the optimal gate conductor work function given the first-type conductivity of the first FET 410. The first work function metal layer 482 can then be chamfered and patterned. The chamfering process can include: depositing a protective fill material onto the first work function metal layer; recessing the protective fill material; etching away the exposed first work function metal material from above the protective fill material such that the maximum height of the first work function metal layer is below the level of the top surface of the sidewall spacer 499; and removing the protective fill material. The patterning process can include: forming a protective mask over the first device region, removing (e.g., selectively etching away) the first work function metal layer 482 from the second device region, and removing protective mask. Next, a second work function metal layer 483 can be conformally deposited in the first and second gate openings 494.1-494.2 over the first work function metal layer 482 in the first device region and over the gate dielectric layer 481 in the second device region. The metal material or metal alloy material of the conformal second work function metal layer 483 can be preselected in order to achieve the optimal gate conductor work function given the second-type conductivity the second FET 450. The chamfering process can include: depositing a protective fill material onto the second work function metal layer; recessing the protective fill material; etching away the exposed second work function metal material from above the protective fill material such that the maximum height of the second work function metal layer is below the level of the top surface of the gate sidewall spacer 499; and removing the protective fill material. Finally, a conductive fill material 484 can be deposited to fill any remaining space in the first and second gate openings 494, thereby completing formation of first and second RMGs 416, 456, respectively, and a polishing process (e.g., a CMP process) can be performed to remove any RMG materials from above the top surface of the sacrificial material 495. Consequently, the first RMG 416 and the second RMG 456 are electrically isolated from each other by the first isolation region 476.

Dielectric gate caps 485 can be formed on the top surfaces of the RMGs 416, 456 (i.e., a first dielectric gate cap can be formed on the top surface of the first RMG 416 and a second dielectric gate cap can be formed on the top surface of the second RMG 456). For example, the conductive fill material 484 of the first RMG 416 and the second RMG 456 can be recessed (i.e., etched back) and a dielectric cap layer (e.g., a silicon nitride cap layer) can be deposited over the partially completed structure so as to fill the recesses above the conductive fill material 484. Next, a polishing process (e.g., a CMP process) can be performed so as to remove any of the dielectric cap material from above the top surface of the sacrificial material 495, thereby forming the dielectric gate caps 485.

The additional processing used to complete the IC structure 400 can also include, but is not limited to, selectively removing any remaining sacrificial material 495 adjacent to the first source/drain regions 413 (including any epitaxial portions 414) and the second source/drain regions 453 (including any epitaxial portions 454) (e.g., using at least one selective etch process), thereby creating contact openings. Then, the various contact openings can be filled with replacement metal contacts (RMCs) (also referred to as self-aligned contacts) (see process 322 and FIGS. 24A-24D). The RMCs can be formed, for example, by optionally depositing one or more conformal layers such as a conformal adhesive layer (e.g., a titanium adhesive layer or other suitable adhesive layer) and/or a conformal barrier layer (e.g., titanium nitride barrier layer or other suitable barrier layer) to line the contact openings and, then, depositing a conductor and, particularly, a metal or metal alloy (e.g., a tungsten, cobalt, aluminum or any other suitable metal plug material) to fill the remaining spaces within the contact openings. Following deposition of the conductor, a polishing process (e.g., a CMP process) can be performed in order to remove any contact material from above the first RMG 416, the second RMG 456, the first isolation region 476 and the second isolation region(s) 466. In any case, the RMCs can include, for example, first RMCs 419*a-b* contacting the first source/drain regions 413 and, particularly, immediately adjacent to the epitaxial portions 414, if present, and second RMCs 459*a-b* contacting the second source/drain regions 453 and, particularly, immediately adjacent to the epitaxial portions 454, if present. As illustrated, a second isolation region 466 can be positioned laterally between each pair of adjacent RMCs on a given side of the gates such that the adjacent RMCs are electrically isolated from each other by the second isolation region 466. For example, see the second isolation regions 466 between the first RMC 419a and the second RMC 459a and between the first RMC 419b and the second RMC 459b.

In each of the above-described method embodiments, the selected isolation material used to fill the first trench (i.e., the gate cut trench) and the second trench(es) (i.e., the contact cut trench(es)) can be a low-K isolation material for optimal performance. Furthermore, since the same process step is used to fill both types of trenches, only a single chemical mechanical polishing (CMP) process is needed to remove the isolation material from above the gate level, thereby minimizing gate height loss and process variation.

Also disclosed herein are embodiments of an integrated circuit (IC) structure that incorporates multiple field effect transistors (e.g., fin-type field effect transistors (FINFETs)) with discrete replacement metal gates (RMGs) and replacement metal contacts (RMCs). Specifically, the IC structures 200 of FIGS. 12A-12D and 400 of FIGS. 24A-24D can each include at least a first field effect transistor 210, 410 (e.g., a first fin-type field effect transistor (FINFET)) and a second field effect transistor 250, 450 (e.g., a second fin-type field effect transistor (FINFET)). The first FET 210, 410 can have a first-type conductivity (e.g., can be a P-type FET) and the second FET 250, 450 can have a second-type conductivity (e.g., can be an N-type FET).

The first FET 210, 410 can include one or more first semiconductor bodies 211, 411 (e.g., one or more first semiconductor fins). Each first semiconductor body 211, 411 can have a first channel region 212, 412 positioned laterally between first source/drain regions 213, 413, including optional first epitaxial portions 214, 414. Each first channel region 212, 412 can, optionally, be doped so as to have the second-type conductivity at a relatively low conductivity level (e.g., N− conductivity). The first source/drain regions 213, 413, including the epitaxial portions 214, 414, can be doped so as to have the first-type conductivity at a relatively high conductivity level (e.g., P+ conductivity).

The first FET 210, 410 can further include a first replacement metal gate (RMG) 216, 416, which has a first work function, adjacent to the first channel region 212, 412 in each first semiconductor body 211, 411.

The second FET 250, 450 can include one or more second semiconductor bodies 251, 451 (e.g., one or more second semiconductor fins). Each second semiconductor body 251, 451 can have a second channel region 252, 452 positioned laterally between second source/drain regions 253, 453, including optional second epitaxial portions 254, 454. Each second channel region 252, 452 can, optionally, be doped so as to have the first-type conductivity at a relatively low conductivity level (e.g., P− conductivity). The second source/drain regions 253, 453, including the epitaxial portions 254, 454, can be doped so as to have the second-type conductivity at a relatively high conductivity level (e.g., N+ conductivity). The second FET 250, 450 can further include a second RMG 256, 456 adjacent to the second channel region 252, 452 in each second semiconductor body 251, 451. The second RMG 256, 456 can have a second work function that is different from the first work function. It should be noted that the second RMG 256, 456 can be adjacent to and in end-to-end alignment with the first RMG 216, 416. That is, the first RMG can have a first inner end, a first outer end opposite the first inner end, and first opposing sides. The second RMG can have a second inner end aligned with and facing the first inner end, a second outer end opposite the second inner end, and second opposing sides.

The IC structure 200, 400 can further include a gate sidewall spacer 299, 499 that laterally surrounds the first RMG and the second RMG. That is, the gate sidewall spacer 299, 499 can be positioned laterally immediately adjacent to the first outer end and the first opposing sides of the first RMG 216, 416 and further positioned laterally immediately adjacent to the second outer end and the second opposing sides of the second RMG 256, 456. The gate sidewall spacer 299, 499 can be, for example, a silicon nitride gate sidewall spacer.

The IC structure 200, 400 can further include various replacement metal contacts (RMCs). These RMCs can include, for example, first RMC 219a-b, 419a-b to the first source/drain regions 213, 413 (or, more particularly, to the first epitaxial portions 214, 414 of the first source/drain regions 213, 413, if present) of the first FET 210, 410. These RMCs can also include second RMCs 259a-b, 459a-b to the second source/drain regions 253, 453 (or, more particularly, to the second epitaxial portions 254, 454 of the second source/drain regions 253, 453, if present) of the second FET 250, 450.

The IC structure 200, 400 can further include a first isolation region 276, 476 (referred to herein as a gate cut isolation region). The first isolation region 276, 476 can include a first trench, which is filled with isolation material 292, 492. The first trench and, thereby the first isolation region 276, 476 can be positioned laterally between and immediately adjacent to the first inner end of the first RMG 216, 416 and the second inner end of the second RMG 256, 456. The first trench and, thereby the first isolation region 276, 476 can also be positioned laterally between opposing portions of the gate sidewall spacer 299, 499. Thus, the first isolation region 276, 476 can electrically isolation the first RMG 216, 416 and the second RMG 256, 456 from each other.

Figure 12A:
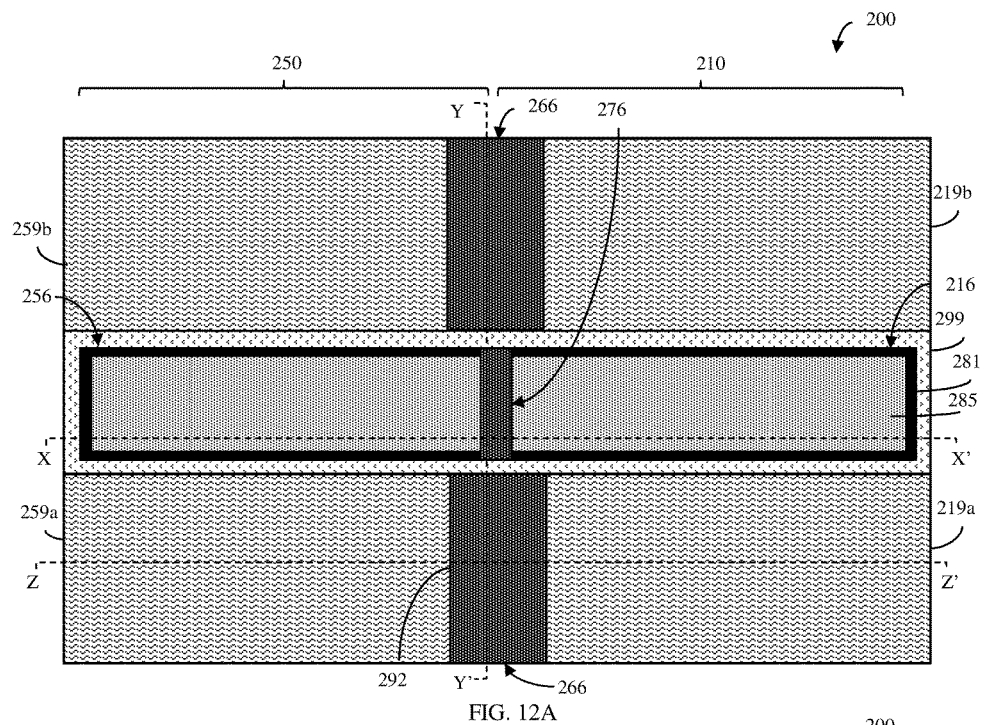
FIG. 12A is a top view diagram and FIGS. 12B-12D are different cross-section diagrams illustrating an integrated circuit structure formed according to the method of FIG. 1.
Figure 12B:
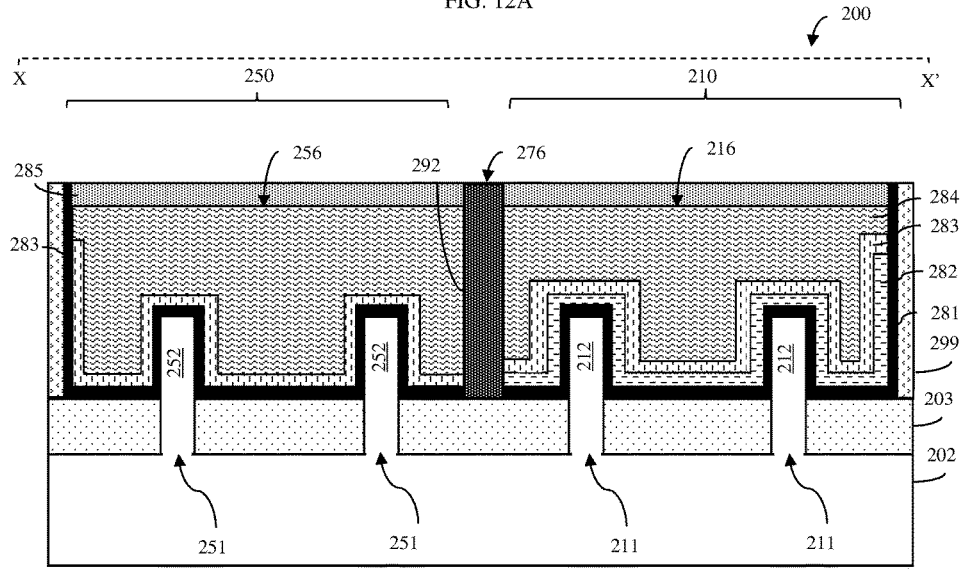
Figure 12C:
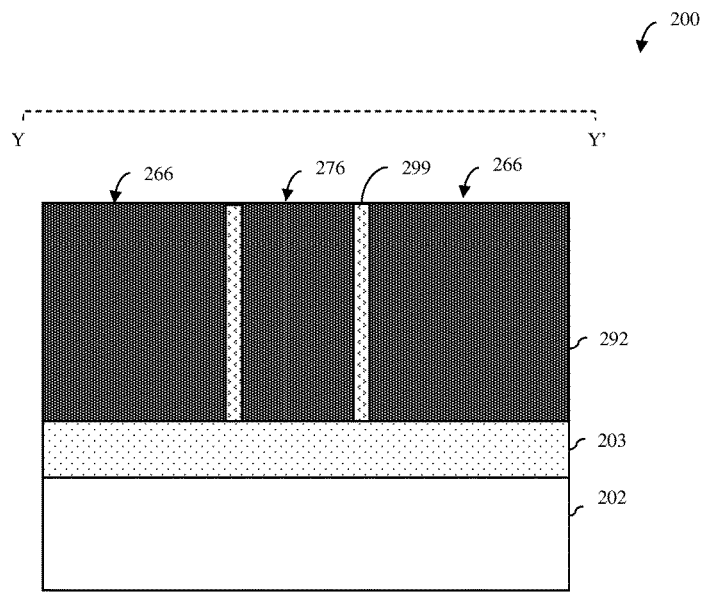
Figure 12D:
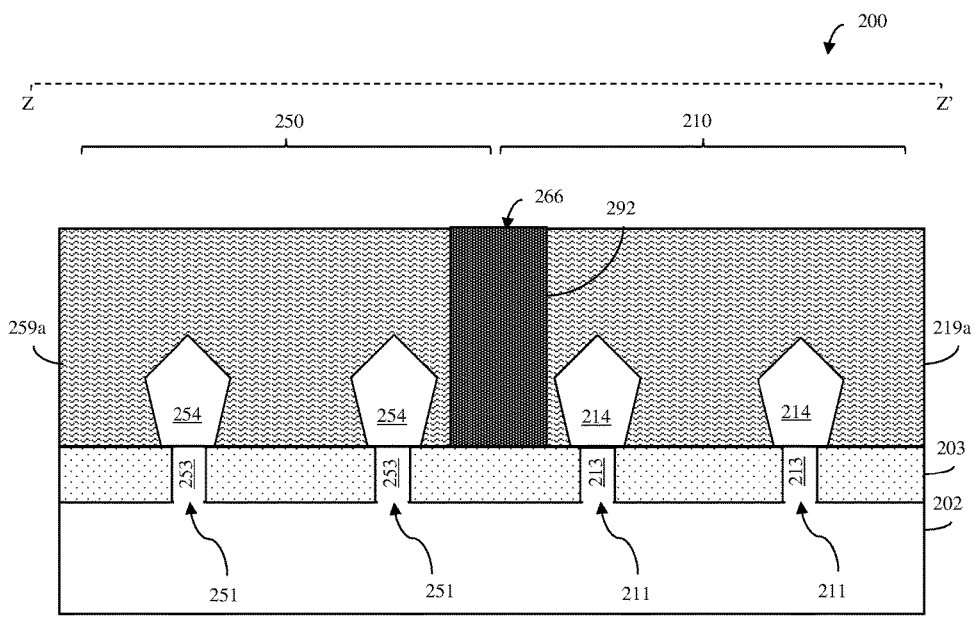
Figure 24A:
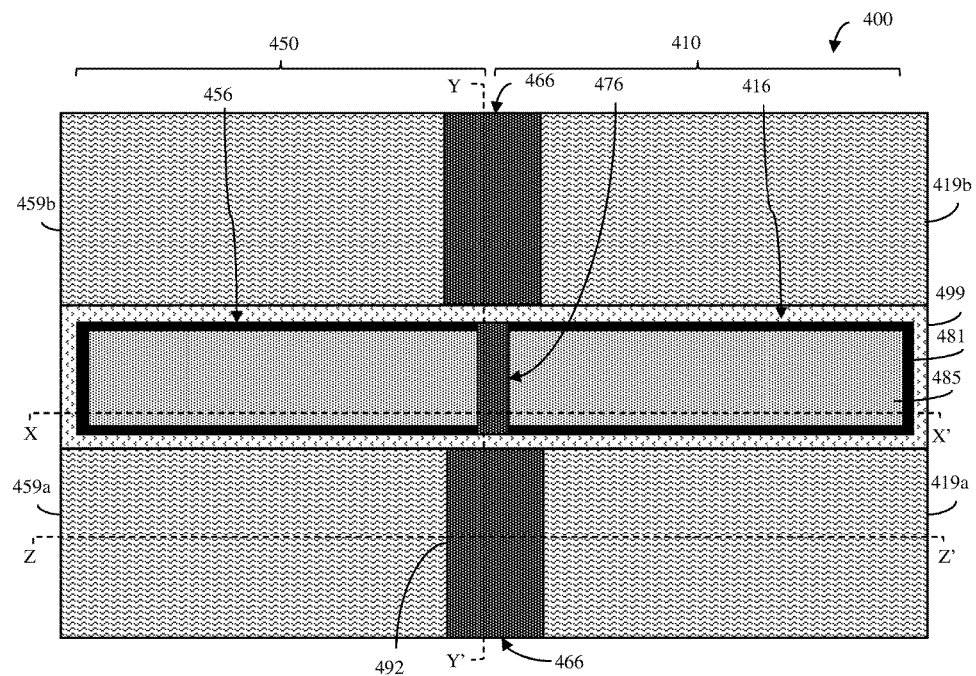
FIG. 24A is a top view diagram and FIGS. 24B-24D are different cross-section diagrams illustrating an integrated circuit structure formed according to the method of FIG. 13.
Figure 24B:
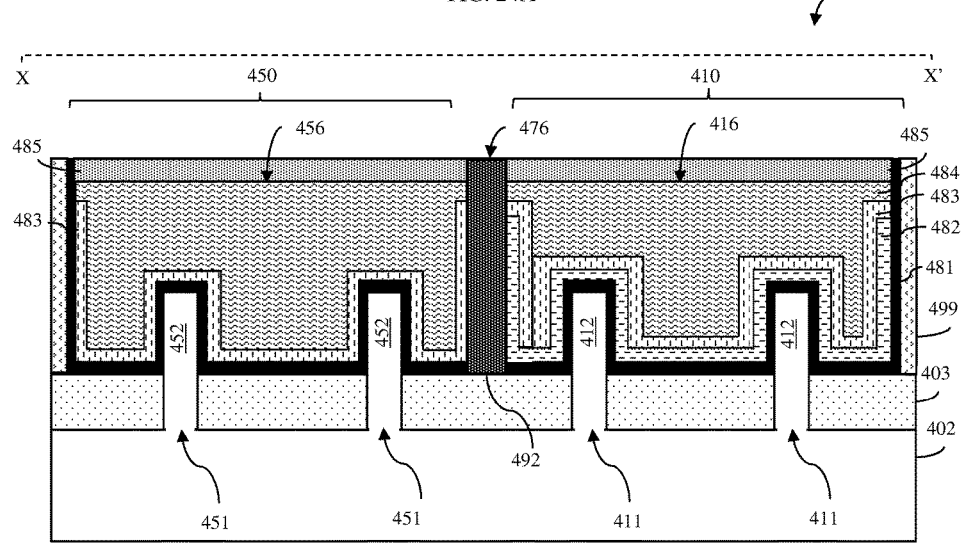
Figure 24C:
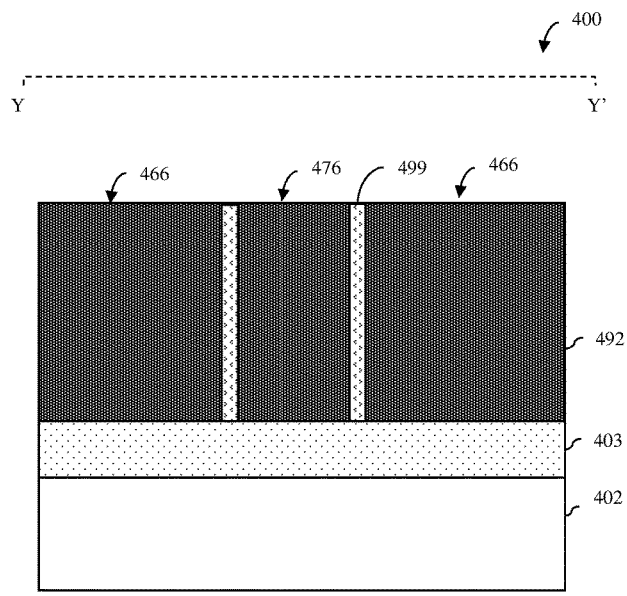
Figure 24D:
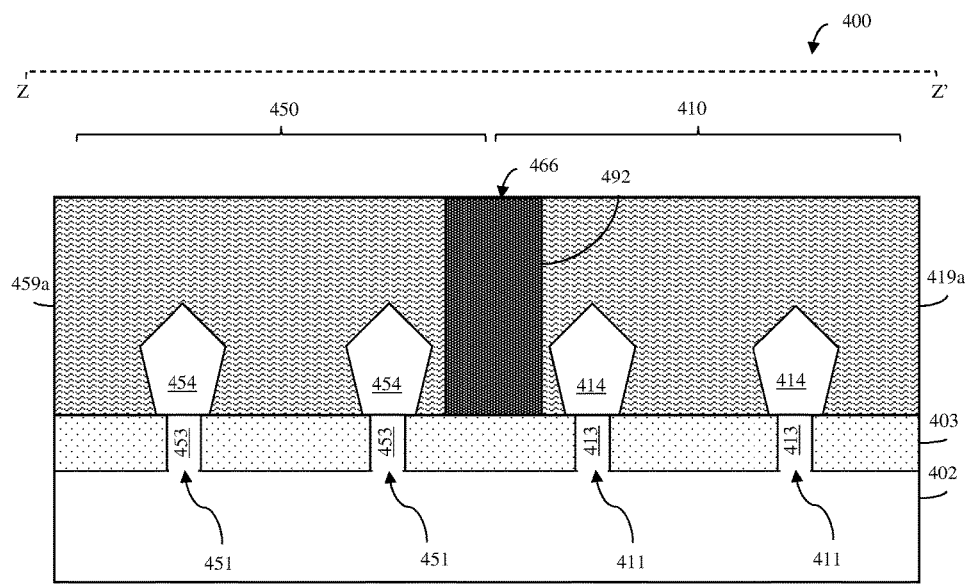

The IC structure 200, 400 can further include one or more second isolation regions 266, 466 (referred to herein as a contact cut isolation region). Each second isolation region 266, 466 can include a second trench, which is filled with the same isolation material 292, 492 as the first trench (i.e., the isolation material in the first and second trenches is identical). Each second isolation region 266, 466 can be positioned laterally between and immediately adjacent two adjacent replacement metal contacts. For example, as illustrated in FIGS. 12A and 24A, a second isolation region 266, 466 can be positioned laterally between and immediately adjacent to a first RMC 219a, 419a and a second RMC 259a, 459a so as to electrically isolation the first RMC 219a, 419a and the second RMC 259a, 459a from each other. Additionally or alternatively, another second isolation region 266, 466 can be positioned laterally between and immediately adjacent to a first RMC 219b, 419b and a second RMC 259b, 459b so as to electrically isolation the first RMC 219b, 419b and the second RMC 259b, 459b from each other.

As mentioned above, the isolation material 292, 492 of the first isolation region 276, 476 and the second isolation region(s) 266, 466 can be the same isolation material. Optionally, the isolation material 292, 492 can be a low-K isolation material (i.e., a dielectric material with a dielectric constant (K) that is no greater than 3.9 or the dielectric constant of silicon dioxide) for optimal device performance. For example, the isolation material 292, 492 can be silicon oxycarbide (SiOC).

Furthermore, since, during processing, the same step is used to fill the first and second trenches, only a single chemical mechanical polishing (CMP) process is needed to remove the isolation material from above the gate level. Thus, in the above-described IC structure 200, 400 there is minimum gate-to-gate height variation.

In the method and structure embodiments described above different dopants can be used to achieve the different type conductivities in different regions of the semiconductor bodies, as described. Furthermore, the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (Mg), whereas a gallium nitride (GaN)-based semiconductor material having an N-type conductivity is typically doped with silicon (Si). Those skilled in the art will also recognize that different conductivity levels will depend upon the relative concentration levels of the dopants.

Also, in the method and structure embodiments described above, a high-K gate dielectric layer refers to a layer of dielectric material with a dielectric constant that is greater than the dielectric constant of silicon dioxide (i.e., greater than 3.9). Exemplary high-K dielectric materials that may be used in the above-described RMGs include, but are not limited to, hafnium (HO-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). Additionally, in the method and structure embodiments described above, a first work function metal layer is preselected to have a first work function optimal for performance of the first FET having a first-type conductivity (e.g., the P-type FET) and the second work function metal layer is preselected to have a second work function optimal for performance of the second FET having the second-type conductivity (e.g., the N-type FET). Those skilled in the art will recognize that the optimal work function for a gate conductor of a P-type FET will be, for example, between about 4.9 eV and about 5.2 eV. Exemplary metals (and metal alloys), which have a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Those skilled in the art will further recognize that the optimal work function for a gate conductor of an N-type FET will be, for example, between 3.9 eV and about 4.2 eV. Exemplary metals (and metal alloys), which have a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. Finally, in the method and structure embodiments described above, the conductive fill material of the RMGs can be any suitable metal or metal alloy fill material including, but not limited to, tungsten, a tungsten alloy (e.g., tungsten silicide or titanium tungsten), cobalt, or aluminum.

It should be understood that the terminology used herein is for the purpose of describing the disclosed method and structure and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are embodiments of an improved method for forming an integrated circuit (IC) structure that incorporates multiple field effect transistors (FETs) (e.g., fin-type field effect transistors (FINFETs)) with discrete replacement metal gates (RMGs) and replacement metal contacts (RMCs). In the method, gate cut trench(es) and contact cut trench(es) can be formed at the same process level. The gate cut trench(es) and the contact cut trench(es) can then be filled at the same time with the same isolation material to form gate cut isolation region(s) for electrically isolating adjacent RMGs and contact cut isolation region(s) for electrically isolating adjacent RMCs, respectively. The selected isolation material can be a low-K isolation material for optimal performance. Furthermore, since the same process step is used to fill both types of trenches, only a single chemical mechanical polishing (CMP) process is needed to remove the isolation material from above the gate level, thereby minimizing gate height loss and process variation. Also disclosed above are embodiments of an IC structure formed according to the above-described method.

What is claimed is:

1. An integrated circuit structure comprising:
   a first transistor comprising:
      a first semiconductor body having a first channel region positioned laterally between first source/drain regions; and
      a first gate adjacent to the first channel region;
   a second transistor comprising:
      a second semiconductor body having a second channel region positioned laterally between second source/drain regions; and
      a second gate adjacent to the second channel region;
   metal contacts to the first source/drain regions and the second source/drain regions, wherein the metal contacts comprise at least a first metal contact to a first source/drain region of the first transistor and a second metal contact to a second source/drain region of the second transistor and wherein the first source/drain region of the first transistor is adjacent to the second source/drain region of the second transistor;
   a first isolation region comprising a first trench filled with isolation material and positioned laterally between and immediately adjacent to the first gate and the second gate; and
   a second isolation region comprising a second trench filled with the isolation material and positioned laterally between and immediately adjacent to the first metal contact and the second metal contact.

2. The integrated circuit structure of claim 1, wherein the isolation material comprises a dielectric material with a dielectric constant that is no greater than 3.9.

3. The integrated circuit structure of claim 1, wherein the isolation material comprises silicon oxycarbide.

4. The integrated circuit structure of claim 1, wherein the first gate and the second gate comprise a first replacement metal gate and a second replacement metal gate, respectively.

5. The integrated circuit structure of claim 4, wherein the first replacement metal gate has a first work function and the second replacement metal gate has a second work function that is different from the first work function.

6. The integrated circuit structure of claim 1, wherein the first isolation region and the second isolation region are physically separated by a gate sidewall spacer.

7. An integrated circuit structure comprising:
   a first transistor comprising:
      multiple first semiconductor bodies, each first semiconductor body having a first channel region positioned laterally between corresponding first source/drain regions; and
      a first gate adjacent to each first channel region;
   a second transistor comprising:
      multiple second semiconductor bodies, each second semiconductor body having a second channel region positioned laterally between corresponding second source/drain regions; and
      a second gate adjacent to each second channel region;
   metal contacts to the first source/drain regions and the second source/drain regions, wherein the metal contacts comprise at least a first metal contact to all first source/drain regions on a side of the first gate of the first transistor and a second metal contact to all second source/drain regions on a same side of the second gate of the second transistor;
   a first isolation region comprising a first trench filled with isolation material and positioned laterally between and immediately adjacent to the first gate and the second gate; and
   a second isolation region comprising a second trench filled with the isolation material and positioned laterally between and immediately adjacent to the first metal contact and the second metal contact.

8. The integrated circuit structure of claim 7, wherein the isolation material comprises a dielectric material with a dielectric constant that is no greater than 3.9.

9. The integrated circuit structure of claim 7, wherein the isolation material comprises silicon oxycarbide.

10. The integrated circuit structure of claim 7, wherein the first gate and the second gate comprise a first replacement metal gate and a second replacement metal gate, respectively.

11. The integrated circuit structure of claim 10, wherein the first replacement metal gate has a first work function and the second replacement metal gate has a second work function that is different from the first work function.

12. The integrated circuit structure of claim 7, wherein the first isolation region and the second isolation region are physically separated by a gate sidewall spacer.

13. An integrated circuit structure comprising:
   a first transistor comprising:
      multiple first semiconductor bodies, each first semiconductor body having a first channel region positioned laterally between corresponding first source/drain regions; and
      a first gate adjacent to each first channel region;
   a second transistor comprising:
      multiple second semiconductor bodies, each second semiconductor body having a second channel region positioned laterally between corresponding second source/drain regions; and
      a second gate adjacent to each second channel region, wherein the second gate is in end-to-end alignment with the first gate such that an inner end of the first gate is adjacent to an inner end of the second gate;
   a gate sidewall spacer laterally surrounding the first gate and the second gate such that the gate sidewall spacer is adjacent to an outer end and opposing sidewalls of the first gate and further adjacent to an outer end and opposing sidewalls of the second gate;
   metal contacts to the first source/drain regions and the second source/drain regions, wherein the metal contacts comprise at least a first metal contact to all first source/drain regions on a side of the first gate of the first transistor and a second metal contact to all second source/drain regions on a same side of the second gate of the second transistor;
   a first isolation region comprising a first trench filled with isolation material and positioned laterally between and immediately adjacent to the inner end of the first gate and the inner end of the second gate; and
   a second isolation region comprising a second trench filled with the isolation material and positioned laterally between and immediately adjacent to the first metal contact and the second metal contact, wherein the gate sidewall spacer physically separates the first isolation region from the second isolation region.

14. The integrated circuit structure of claim 13, wherein the isolation material comprises a dielectric material with a dielectric constant that is no greater than 3.9.

15. The integrated circuit structure of claim 13, wherein the isolation material comprises silicon oxycarbide.

16. The integrated circuit structure of claim 13, wherein the first gate and the second gate comprise a first replacement metal gate and a second replacement metal gate, respectively.

17. The integrated circuit structure of claim 16, wherein the first replacement metal gate has a first work function and the second replacement metal gate has a second work function that is different from the first work function.

* * * * *